US008687416B2

(12) United States Patent
Kurokawa

(10) Patent No.: US 8,687,416 B2
(45) Date of Patent: Apr. 1, 2014

(54) SIGNAL PROCESSING CIRCUIT COMPRISING BUFFER MEMORY DEVICE

(75) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 145 days.

(21) Appl. No.: 13/336,284

(22) Filed: Dec. 23, 2011

(65) Prior Publication Data
US 2012/0163071 A1 Jun. 28, 2012

(30) Foreign Application Priority Data
Dec. 28, 2010 (JP) ................................. 2010-291835

(51) Int. Cl.
G11C 11/34 (2006.01)

(52) U.S. Cl.
USPC ................. 365/174; 365/189.08; 365/230.08; 257/298; 438/238; 438/241

(58) Field of Classification Search
USPC ................ 365/174, 189.08, 230.08; 257/298; 438/238, 241
See application file for complete search history.

(56) References Cited

U.S. PATENT DOCUMENTS

| 4,466,081 | A | | 8/1984 | Masuoka |
|---|---|---|---|---|
| 4,719,570 | A | * | 1/1988 | Kawabe ......................... 712/207 |
| 5,731,856 | A | | 3/1998 | Kim et al. |
| 5,742,781 | A | * | 4/1998 | Bajwa ............................ 712/208 |
| 5,744,864 | A | | 4/1998 | Cillessen et al. |
| 6,065,112 | A | * | 5/2000 | Kishida et al. ................ 712/221 |
| 6,127,702 | A | | 10/2000 | Yamazaki et al. |
| 6,294,274 | B1 | | 9/2001 | Kawazoe et al. |
| 6,563,174 | B2 | | 5/2003 | Kawasaki et al. |
| 6,727,522 | B1 | | 4/2004 | Kawasaki et al. |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; AGNE Gijutsu Center (with full English language translation).

(Continued)

Primary Examiner — Connie Yoha
(74) Attorney, Agent, or Firm — Fish & Richardson P.C.

(57) ABSTRACT

It is an object to provide a signal processing circuit for which a complex manufacturing process is not necessary and whose power consumption can be suppressed. In particular, it is an object to provide a signal processing circuit whose power consumption can be suppressed by stopping the power supply for a short time. The signal processing circuit includes a control circuit, an arithmetic unit, and a buffer memory device. The buffer memory device stores data sent from the main memory device or the arithmetic unit in accordance with an instruction from the control unit; the buffer memory device comprises a plurality of memory cells; and the memory cells each include a transistor including an oxide semiconductor in a channel formation region and a memory element to which charge whose amount depends on a value of the data is supplied via the transistor.

18 Claims, 23 Drawing Sheets

(56) References Cited

U.S. PATENT DOCUMENTS

| | | | |
|---|---|---|---|
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,362,538 B2 * | 1/2013 | Koyama et al. | 257/298 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-121444 A | 5/1995 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

Asakuma, N et al., "Crystallization and Reduction of Sol—Gel—Derived Zinc Oxide Films by Irradiation With Ultraviolet Lamp," Journal of Sol—Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependance of Characteristics of Amporphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '9 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al.. "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amporphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al.. "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N e tal., "Spinel, YBFE2O4, and YB2FE3O7 Types of Structures for Compounds in the IN2O3 and SC2O3—A2O3—BO Systems [A; FE, GA, OR AL; B: MG, MN, FE, NI, CU,OR ZN] at Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3)m (m = 7, 8, 9, and 16) in the In2O3—ZnGa2)4—ZnO System," Journal of Solid State Chenistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMCLD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

(56) References Cited

OTHER PUBLICATIONS

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED." AM-FPD '08 Digest of Technical Papers, Jul. 2, 2008, pp. 275-278.

Park. S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Deisplay Workshops, 2009, pp. 689-692.

Son, K e tal., "42.4L: Late-News Paper: 4 Inch QVGA AMOLED Driven by the Threshold Voltage Controlled Ampophous GIZO (Ga—2O3—In2O3—ZnO) TFT," SID Digest '08: SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings fo the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Supttered Al2O3 Gae Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 10

| cache line 0 | tag 0 | valid bit 0 | data field 0 |
|---|---|---|---|
| cache line 1 | tag 1 | valid bit 1 | data field 1 |
| cache line 2 | tag 2 | valid bit 2 | data field 2 |
| cache line 3 | tag 3 | valid bit 3 | data field 3 |
| cache line n-1 | tag n-1 | valid bit n-1 | data field n-1 |

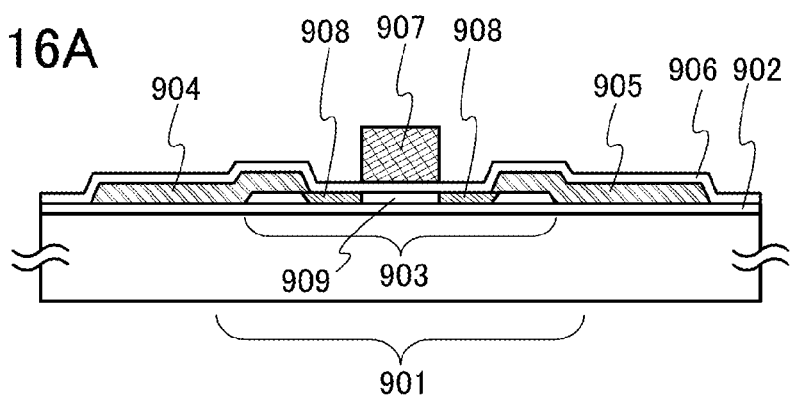
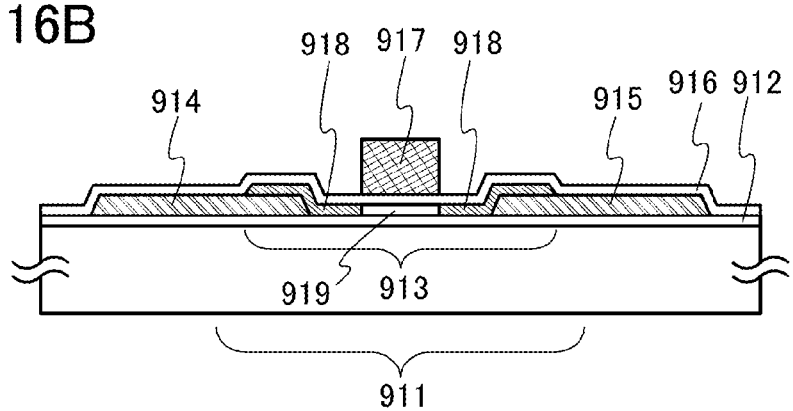
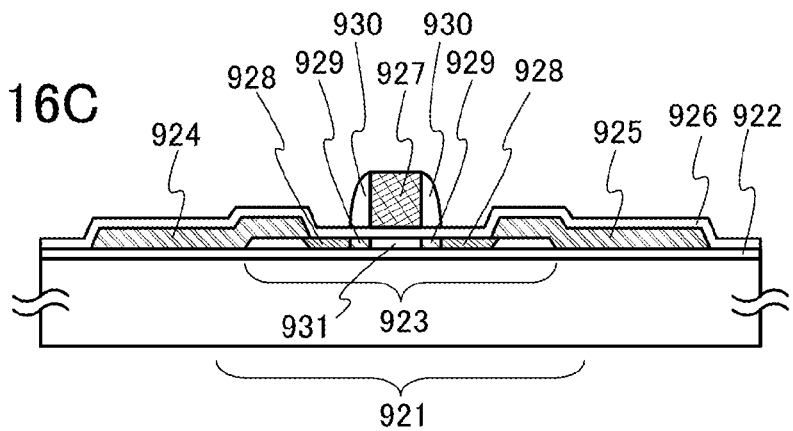
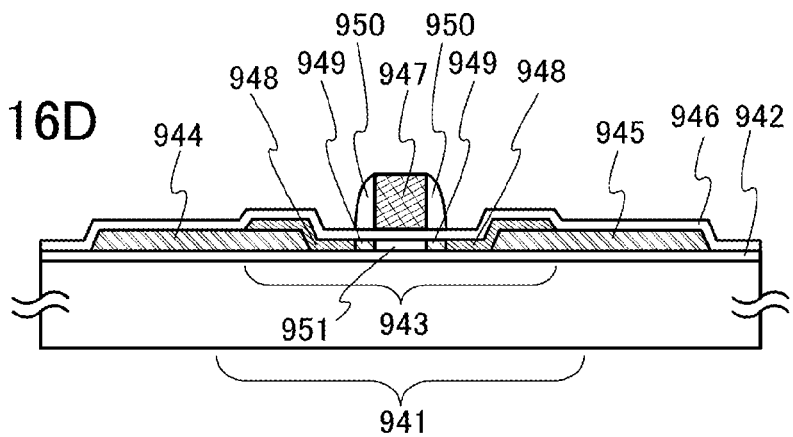

SIGNAL PROCESSING CIRCUIT COMPRISING BUFFER MEMORY DEVICE

BACKGROUND OF THE INVENTION

1. Field of the Invention

The present invention relates to a signal processing circuit including a nonvolatile semiconductor memory device.

2. Description of the Related Art

A signal processing circuit such as a central processing unit (CPU) has a variety of configurations depending on its application but is generally provided with various semiconductor memory devices (hereinafter simply referred to as memory devices) such as a register and a cache memory as well as a main memory device for storing data or an instruction. In addition, a cache is provided in a CPU so as to be located between an arithmetic unit and a main memory device in order to reduce low-speed access to the main memory device and speed up the arithmetic processing.

It is necessary that a memory device such as a cache performs data writing at higher speed than that of a main memory device. Therefore, in general, a flip-flop is used as a register and an SRAM or the like is used as a cache. Further, Patent Document 1 discloses a structure in which a volatile memory such as an SRAM and a nonvolatile memory are used in combination as a cache.

Reference

[Patent Document 1] Japanese Published Patent Application No. H7-121444

SUMMARY OF THE INVENTION

An SRAM has a structure in which a p-channel transistor and an n-channel transistor are connected in series between a node to which a high-level power supply potential is applied and a node to which a low-level power supply potential is applied. The p-channel transistor and the n-channel transistor operate such that when one of the p-channel transistor and the n-channel transistor is turned on, the other thereof is turned off. Therefore, ideally, a current between the node to which the high-level power supply potential is applied and the node to which the low-level power supply potential is applied is zero. However, actually, a minute amount of off-state current flows in the off-state transistor; therefore, the current between the nodes is not be zero. Thus, power consumption is caused in the SRAM even in a holding state in which data writing is not performed.

Although depending on the size of the transistor, for example, when the p-channel transistor and the n-channel transistor which are connected in series are formed using a bulk silicon, an off-state current of approximately 1 pA is generated at room temperature under a condition where a voltage between the nodes is approximately 3 V. Two pairs of p-channel transistors and n-channel transistors which are connected in series are provided in a general SRAM, and thus an off-current of approximately 2 pA is generated. In the case of a cache including about $10^7$ memory elements, an off-state current of the whole cache is 20 µA. As the temperature of an IC chip in which the cache is provided becomes higher, the power consumption becomes larger and the off-state current of the cache becomes several milliamperes.

In order to suppress power consumption, a method for temporarily stopping supply of a power supply potential to a cache in a period during which data is not input and output has been suggested. A volatile memory device in which data is erased when the supply of a power supply potential is stopped is used for a cache. Therefore, in the method, a nonvolatile memory device is provided around the volatile memory device and the data is temporarily transferred to the nonvolatile memory device. However, since such a nonvolatile memory device is mainly formed using a magnetic element or a ferroelectric, the manufacturing process is complex.

In addition, when the power supply is stopped for a long time in a CPU, data in a cache is transferred to an external memory device such as a hard disk or a flash memory before the power supply is stopped, so that the data can be prevented from being erased. However, it takes time to replace the data back in a cache from such an external memory device. Therefore, back up of data using the external memory device such as a hard disk or a flash memory is not suitable in the case where the power supply is stopped for a short time so as to reduce power consumption.

In view of the above-described problems, it is an object of one embodiment of the present invention to provide a signal processing circuit for which a complex manufacturing process is not necessary and whose power consumption can be suppressed. In particular, it is an object to provide a signal processing circuit whose power consumption can be suppressed by stopping the power supply for a short time.

In order to solve the above-described problems, a memory device included in a signal processing circuit according to one embodiment of the present invention includes memory cells each including a memory element and a transistor which functions as a switching element for controlling supply, retention, and discharge of charge in the memory element. Further, the transistor includes, in a channel formation region, a semiconductor whose band gap is wider than that of silicon and whose intrinsic carrier density is lower than that of silicon. As such a semiconductor, for example, an oxide semiconductor, silicon carbide, gallium nitride, or the like which has a band gap which is approximately twice as wide as that of silicon can be used. A transistor including the semiconductor can have much lower off-state current than a transistor including a normal semiconductor material such as silicon or germanium. The transistor having the above structure is used as a switching element for retaining charge flowing into the memory element, whereby leakage of charge from the memory element can be prevented.

Further, the signal processing circuit according to one embodiment of the present invention includes, besides the memory device, an arithmetic unit which exchanges data with the memory device and a variety of logic circuits such as a control unit. The memory device functions as a buffer memory device.

As the memory element, a transistor, a capacitor, or the like can be used, for example.

Note that a highly-purified oxide semiconductor (a purified oxide semiconductor) obtained by reduction of impurities such as moisture or hydrogen which serve as electron donors (donors) and reduction of oxygen deficiency is an intrinsic (i-type) semiconductor or a substantially intrinsic semiconductor. Therefore, a transistor including the oxide semiconductor has a characteristic of very small off-state current. Specifically, the concentration of hydrogen in the highly-purified oxide semiconductor that is measured by secondary ion mass spectrometry (SIMS) is less than $5 \times 10^{18}/\text{cm}^3$ or lower, preferably less than or equal to $5 \times 10^{17}/\text{cm}^3$, more preferably less than or equal to $1 \times 10^{16}/\text{cm}^3$. In addition, the carrier density of the oxide semiconductor that can be measured by Hall effect measurement is less than $1 \times 10^{14}/\text{cm}^3$, preferably less than $1 \times 10^{12}/\text{cm}^3$, more preferably less than $1 \times 10^{11}/\text{cm}^3$. Furthermore, the band gap of the oxide semiconductor is greater than or equal to 2 eV, preferably greater than or equal to 2.5 eV, more preferably greater than or equal to 3 eV. With the use of the oxide semiconductor film which is highly purified by sufficiently reducing the concentration of impurities such as moisture or hydrogen, off-state current of the transistor can be reduced.

The analysis of the concentration of hydrogen in the oxide semiconductor film is described here. The concentration of hydrogen in the semiconductor film is measured by SIMS. It is known that it is difficult to obtain precise data in the proximity of a surface of a sample or in the proximity of an interface between stacked films formed using different materials by the SIMS in principle. Thus, in the case where the distribution of the hydrogen concentration of the film in a thickness direction is analyzed by SIMS, an average value in a region of the film, in which the value is not greatly changed and almost the same value can be obtained is employed as the hydrogen concentration. Further, in the case where the thickness of the film is small, a region where almost the same value can be obtained cannot be found in some cases due to the influence of the hydrogen concentration of the films adjacent to each other. In that case, the maximum value or the minimum value of the hydrogen concentration in the region of the film is employed as the hydrogen concentration of the film. Further, in the case where a mountain-shaped peak having the maximum value or a valley-shaped peak having the minimum value do not exist in the region of the film, the value at the inflection point is employed as the hydrogen concentration.

Various experiments can actually prove low an off-state current of the transistor including the highly-purified oxide semiconductor film as an active layer. For example, even with an element with a channel width of $1\times10^6$ μm and a channel length of 10 μm, in a range of from 1 V to 10 V of voltage (drain voltage) between a source terminal and a drain terminal, an off-state current can be less than or equal to the measurement limit of a semiconductor parameter analyzer, that is, less than or equal to $1\times10^{-13}$ A. In this case, it can be found that an off current density corresponding to a value obtained by dividing the off current by the channel width of the transistor is less than or equal to 100 zA/μm.

Note that an oxide semiconductor preferably contains at least indium (In) or zinc (Zn). In particular, In and Zn are preferably contained. As a stabilizer for reducing variation in electric characteristics of a transistor including the oxide, gallium (Ga) is preferably additionally included. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The above oxide semiconductor may contain silicon.

Note that, for example, an In—Ga—Zn-based oxide means an oxide containing In, Ga, and Zn, and there is no limitation on the ratio of In, Ga, and Zn. Further, the In—Ga—Zn-based oxide may contain a metal element other than In, Ga, and Zn. Note that an In—Ga—Zn-based oxide has sufficiently high resistance when there is no electric field and thus an off-state current can be sufficiently reduced. In addition, also having high field-effect mobility, the In—Ga—Zn-based oxide is suitable for a semiconductor material used in a signal processing circuit.

The application of the memory element having the above structure to the memory device such as the buffer memory device included in the signal processing circuit makes it possible to prevent data in the memory device from being erased due to the stop of the power supply. Therefore, the power supply can be stopped even for a short time in the signal processing circuit or one or a plurality of logic circuits included in the signal processing circuit. Accordingly, it is possible to provide a signal processing circuit whose power consumption can be suppressed and a method for driving the signal processing circuit whose power consumption can be suppressed.

BRIEF DESCRIPTION OF THE DRAWINGS

In the accompanying drawings:

FIG. 10 is a diagram illustrating a structure of a buffer memory device;

FIGS. 16A to 16D are cross-sectional views of transistors;

DETAILED DESCRIPTION OF THE INVENTION

Hereinafter, embodiments and an example of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments and example below.

A signal processing circuit of the present invention includes in its category an integrated circuit such as a large scale integrated circuit (LSI) including a microprocessor, an image processing circuit, a digital signal processor (DSP), or a microcontroller.

Embodiment 1

Figure 1A:
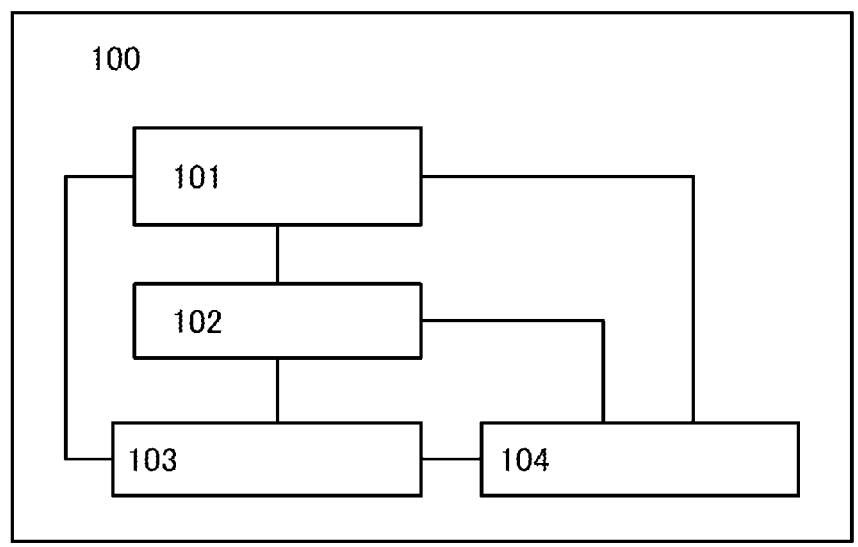
FIGS. 1A to 1C are a block diagram of a signal processing circuit, a diagram illustrating a structure of a memory cell, and a cross-sectional view of a transistor, respectively.

A signal processing circuit according to one embodiment of the present invention includes at least a control unit, one or a plurality of arithmetic units, and one or a plurality of buffer memory devices. FIG. 1A illustrates one example of a signal processing circuit 100 according to one embodiment of the present invention. The signal processing circuit 100 illustrated in FIG. 1A includes a control unit 101, an arithmetic unit 102, a buffer memory device 103, and a main memory device 104.

The control unit 101 is a circuit which controls operations of the arithmetic unit 102, the buffer memory device 103, and the main memory device 104 which are included in the signal processing circuit 100. The arithmetic unit 102 is a logic circuit which performs arithmetic operations such as logic operations, four arithmetic operations, and the like. The buffer memory device 103 has a function of temporary storing data at the time of the arithmetic operations in the arithmetic unit 102, and/or a function of temporary storing an instruction which is carried out by the control unit 101.

The main memory device 104 can store the instruction which is carried out by the control unit 101 and/or can store data output from the arithmetic unit 102. Note that in FIG. 1A, a structure in which the main memory device 104 is provided in the signal processing circuit 100 as a part thereof is illustrated, but the main memory device 104 may be provided outside the signal processing circuit 100.

The buffer memory device 103 is provided between the arithmetic unit 102 and the main memory device 104 or between the control unit 101 and the main memory device 104, so that low-speed access to the main memory device 104 can be reduced and the speed of signal processing such as arithmetic processing can be higher.

A plurality of memory cells is provided in the buffer memory device 103, and each of the memory cells includes a memory element and a transistor whose off-state current or leakage current is extremely low and which is used for controlling the retention of charge in the memory element.

Figure 1B:
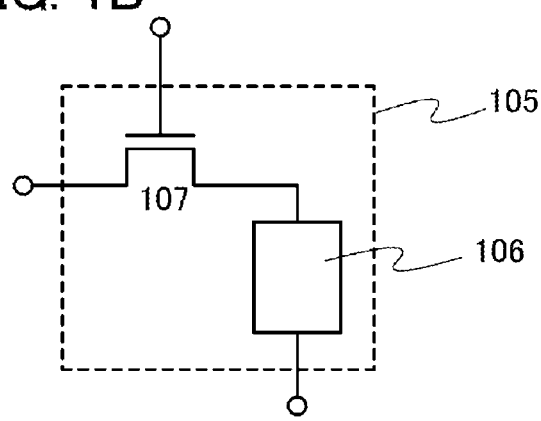

FIG. 1B is a circuit diagram illustrating a structure of a memory cell included in the buffer memory device 103, as an example. In the circuit diagram shown in FIG. 1B, a memory cell 105 includes a memory element 106 and a transistor 107 which functions as a switching element. A semiconductor element such as a capacitor or a transistor can be used for the memory element 106. In the memory element 106, charge is accumulated in a capacitor or a gate capacitance formed between a gate electrode and an active layer of a transistor, whereby data is stored.

The transistor 107 functioning as a switching element controls supply of charge to the memory element 106, discharge of the charge from the memory element 106, and retention of the charge in the memory element 106.

Note that the memory cell 105 may further include another circuit element such as a transistor, a diode, a resistor, or an inductor as needed.

In one embodiment of the present invention, a channel formation region of the transistor 107 which functions as a switching element includes a semiconductor material whose band gap is wider than that of a silicon semiconductor and whose intrinsic carrier density is lower than that of silicon. When a semiconductor material having such characteristics is included in the channel formation region, the transistor 107 with extremely low off-state current or extremely low leakage current can be achieved.

The length of a data retention time depends on the amount of leakage of charge accumulated in the memory element 106 via the transistor 107. Accordingly, the use of the transistor 107 having the above structure as a switching element for retaining the charge accumulated in the memory element 106 makes it possible to prevent leakage of the charge from the memory element 106 and to ensure a long data retention time.

Unless otherwise specified, in the case of an n-channel transistor, an off-state current in this specification is a current which flows between a source electrode and a drain electrode when a potential of the drain electrode is higher than that of the source electrode and that of a gate electrode while the potential of the gate electrode is less than or equal to zero when a reference potential is the potential of the source electrode. Alternatively, in this specification, in the case of a p-channel transistor, an off-state current is a current which flows between a source electrode and a drain electrode when a potential of the drain electrode is lower than that of the source electrode or that of a gate electrode while the potential of the gate electrode is greater than or equal to zero when a reference potential is the potential of the source electrode. Further, a leakage current is a current which flows between a source electrode and a gate electrode or between a drain electrode and the gate electrode, through an insulating film.

As one example of a semiconductor material whose band gap is wider than that of a silicon semiconductor and whose intrinsic carrier density is lower than that of silicon, a compound semiconductor such as silicon carbide (SiC) or gallium nitride (GaN), an oxide semiconductor formed of metal oxide such as zinc oxide (ZnO), or the like can be used. Among the above, an oxide semiconductor has an advantage of high mass productivity because the oxide semiconductor can be formed by a sputtering method, a wet process, or the like. Further, unlike silicon carbide or gallium nitride, the oxide semiconductor can be formed at room temperature, and thus the oxide semiconductor can be formed on a glass substrate or on an integrated circuit using a semiconductor element. Further, a larger substrate can be used. Accordingly, among the semiconductors with wide band gaps, the oxide semiconductor particularly has an advantage of high mass productivity. Further, in the case where an oxide semiconductor with high crystallinity is to be obtained in order to improve the properties of a transistor (e.g., field-effect mobility), the oxide semiconductor with crystallinity can be easily obtained by heat treatment at 250° C. to 800° C.

In the following description, an example in which an oxide semiconductor with the above advantages is used as a semiconductor film of the transistor 107 is given.

Note that in FIG. 1B, the transistor 107 has a gate electrode on one side of an active layer. When the transistor 107 has a pair of gate electrodes between which the active layer is provided, a signal for controlling switching is supplied to one of the gate electrodes, and the other of the gate electrodes may be in a floating state (i.e., electrically insulated) or a potential may be supplied to the other of the gate electrodes. In the latter case, potentials with the same level may be applied to the pair of electrodes, or a fixed potential such as a ground potential may be applied only to the other of the gate electrodes. By controlling the level of a potential applied to the other of the gate electrodes, a threshold voltage of the transistor 107 can be controlled.

Although FIG. 1B illustrates the structure in which the memory cell 105 includes one transistor 107 which functions as a switching element, one embodiment of the present invention is not limited to this structure. In one embodiment of the present invention, it is acceptable as long as one transistor which functions as a switching element is provided in every memory cell, and the number of such transistors may be two or more. In the case where the memory cell 105 includes a plurality of transistors which function as switching elements, the plurality of transistors may be connected to each other in parallel, in series, or in combination of parallel connection and series connection.

Note that in this specification, the state in which the transistors are connected to each other in series means, for example, the state in which only one of a first terminal and a second terminal of a first transistor is connected to only one of a first terminal and a second terminal of a second transistor. Further, the state in which the transistors are connected to each other in parallel means a state in which the first terminal of the first transistor is connected to the first terminal of the second transistor and the second terminal of the first transistor is connected to the second terminal of the second transistor.

Figure 1C:
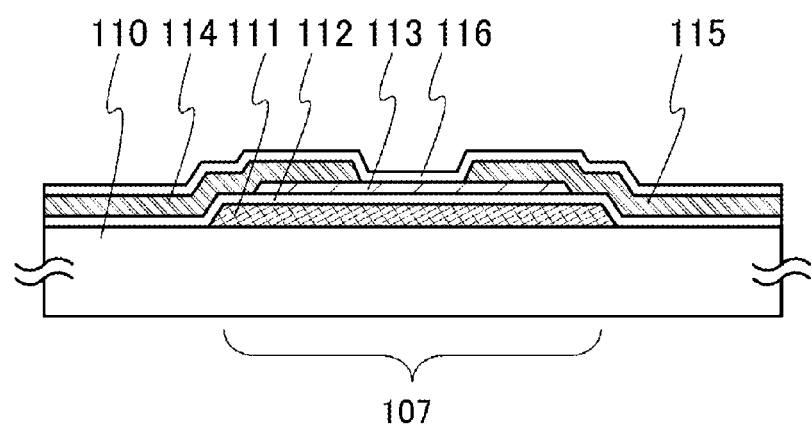

Next, an example of a cross-sectional view of the transistor 107 illustrated in FIG. 1B is illustrated in FIG. 1C.

The transistor 107 in FIG. 1C includes, over a substrate 110 having an insulating surface, a gate electrode 111; an insulating film 112 over the gate electrode 111; an oxide semiconductor film 113 which functions as an active layer and overlaps with the gate electrode 111 with the insulating film 112 provided therebetween; and a source electrode 114 and a drain electrode 115 over the oxide semiconductor film 113. In FIG. 1C, an insulating film 116 is formed over the oxide semiconductor film 113, the source electrode 114, and the drain electrode 115. The insulating film 116 may be included as a component of the transistor 107.

Note that although FIG. 1C illustrate the case where the transistor 107 has a single-gate structure, the transistor 107 may have a multi-gate structure in which a plurality of electrically connected gate electrodes are included so that a plurality of channel formation regions are included.

The buffer memory device 103 including the above-described memory cells is capable of retaining data even when the supply of a power supply voltage to the buffer memory device 103 is stopped. Therefore, the supply of the power supply voltage to the whole signal processing circuit 100 can be stopped to suppress power consumption. Alternatively, the supply of the power supply voltage to the buffer memory device 103 can be stopped to suppress power consumption.

In addition, as well as the supply of the power supply voltage to the buffer memory device 103, the supply of the power supply voltage to the control unit 101 or the arithmetic unit 102 which exchanges data with the buffer memory device 103 may be stopped. For example, when the arithmetic unit 102 and the buffer memory device 103 are not operated, the supply of the power supply voltage to the arithmetic unit 102 and the buffer memory device 103 may be stopped.

FIGS. 2A to 2C and FIGS. 3A to 3D illustrate specific examples of structures of the memory cell 105.

Note that the term "connection" in this specification refers to electrical connection and corresponds to the state in which current, a potential, or voltage can be supplied or transmitted. Accordingly, a connection state means not only a state of a direct connection but also a state of indirect connection through a circuit element such as a wiring, a resistor, a diode, or a transistor so that current, a potential, or voltage can be supplied or transmitted.

In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

The names of the "source electrode" and the "drain electrode" included in the transistor interchange with each other depending on the polarity of the transistor or the levels of potentials applied to the respective electrodes. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. Hereinafter, one of a source electrode and a drain electrode will be referred to as a first terminal, and the other, a second terminal.

Figure 2A:
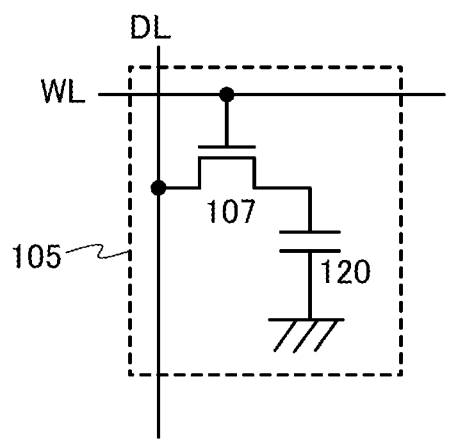
FIGS. 2A to 2C are circuit diagrams of memory cells.

The memory cell 105 illustrated in FIG. 2A includes the transistor 107 functioning as a switching element and a capacitor 120 functioning as a memory element. A gate electrode of the transistor 107 is connected to a word line WL. A first terminal of the transistor 107 is connected to a data line DL and a second terminal thereof is connected to one electrode of the capacitor 120. The other electrode of the capacitor 120 is connected to a node to which a fixed potential such as a ground potential is supplied.

In the memory cell 105 illustrated in FIG. 2A, the transistor 107 is turned on at the time of data writing, so that a potential of a signal including data is supplied from the data line DL to the one electrode of the capacitor 120 via the transistor 107. The amount of charge accumulated in the capacitor 120 is controlled in accordance with the potential of the signal, so that data is written to the capacitor 120.

Then, the transistor 107 is turned off when data is retained, so that the charge is retained in the capacitor 120. As described above, the transistor 107 has a characteristic of extremely low off-state current or extremely low leakage current. Therefore, the charge accumulated in the capacitor 120 is difficult to leak, and thus, the data can be retained for a long period of time as compared to the case where a semiconductor material such as silicon is used for the transistor 107.

At the time of data reading, the transistor 107 is turned on, so that the charge accumulated in the capacitor 120 is taken out via the data line DL. The difference in the amount of charge is read, whereby data can be read.

Figure 2B:
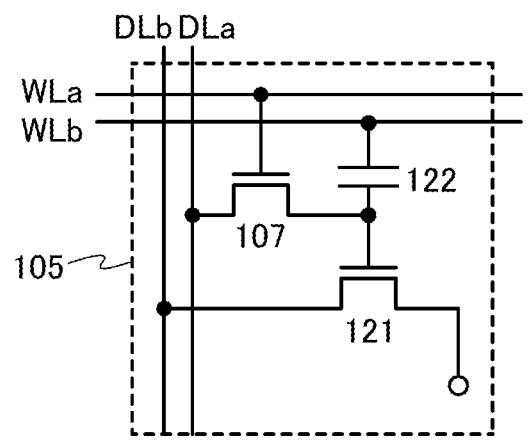

The memory cell 105 illustrated in FIG. 2B includes the transistor 107 functioning as a switching element, and a transistor 121 and a capacitor 122 which function as memory elements. The gate electrode of the transistor 107 is connected to a first word line WLa. The first terminal of the transistor 107 is connected to a first data line DLa and the second terminal thereof is connected to a gate electrode of the transistor 121. A first terminal of the transistor 121 is connected to a second data line DLb, and a second terminal thereof is connected to a node to which a predetermined potential is applied. The capacitor 122 includes a pair of electrodes, one of the electrodes is connected to the gate electrode of the transistor 121, and the other thereof is connected to a second word line WLb.

In the memory cell 105 illustrated in FIG. 2B, the transistor 107 is turned on at the time of data writing, so that a potential of a signal including data is supplied from the first data line DLa to the gate electrode of the transistor 121 via the transistor 107. A gate capacitance of the transistor 121 and the amount of charge accumulated in the capacitor 122 are controlled in accordance with the potential of the signal, so that data is written to the transistor 121 and the capacitor 122.

When data is retained, the transistor 107 is turned off, so that the charge accumulated in the gate capacitance of the transistor 121 and the capacitor 122 is retained. As described above, the transistor 107 has a characteristic of extremely low off-state current or extremely low leakage current. Therefore, the accumulated charge is difficult to leak, and thus, the data can be retained for a long period of time as compared to the case where a semiconductor material such as silicon is used for the transistor 107.

At the time of data reading, a potential of the second word line WLb is changed. A potential difference between the pair of electrodes included in the capacitor 122 is kept in accordance with the principle of charge conservation, and thus, the change in the potential of the second word line WLb is supplied to the gate electrode of the transistor 121. A threshold voltage of the transistor 121 is changed depending on the amount of charge accumulated in the gate capacitance of the transistor 121. Therefore, a difference in the amount of accumulated charge is read from the amount of a drain current of the transistor 121 which is obtained through the change in the potential of the gate electrode of the transistor 121, so that data can be read.

Note that an oxide semiconductor film may be used for an active layer of the transistor 121 functioning as a memory element. Alternatively, for the active layer of the transistor 121, instead of the semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. The use of oxide semiconductor films for active layers of all the transistors in the memory cell 105 makes it possible to simplify a manufacturing process. Further, for example, the active layer of the transistor 121 functioning as a memory element is formed using a semiconductor material such as polycrystalline silicon or single crystal silicon which provides higher mobility than an oxide semiconductor, whereby data can be read from the memory cell 105 at high speed.

Figure 2C:
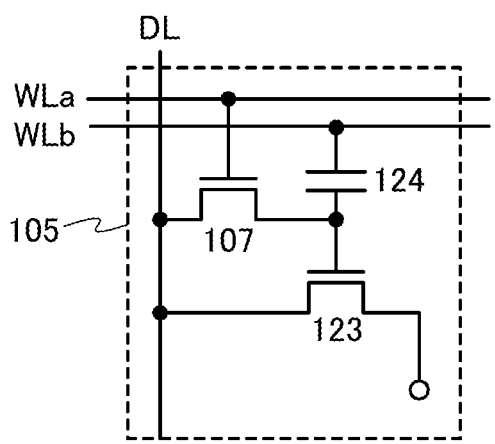

The memory cell 105 illustrated in FIG. 2C is different from the memory cell 105 illustrated in FIG. 2B in that one data line DL has functions of the first data line DLa and the second data line DLb. Specifically, the memory cell 105 illustrated in FIG. 2C includes the transistor 107 functioning as a switching element, and a transistor 123 and a capacitor 124 which function as memory elements. The gate electrode of the transistor 107 is connected to the first word line WLa. The first terminal of the transistor 107 is connected to the data line DL and the second terminal thereof is connected to a gate electrode of the transistor 123. The first terminal of a transistor 123 is connected to the data line DL and a second terminal thereof is connected to a node to which a predetermined potential is applied. The capacitor 124 includes a pair of electrodes, one of the electrodes is connected to a gate electrode of the transistor 123, and the other thereof is connected to the second word line WLb.

Operation such as writing, retention, and reading of data can be performed in the memory cell 105 illustrated in FIG. 2C in a manner similar to that in the memory cell 105 illustrated in FIG. 2B.

In addition, an oxide semiconductor film may be used for an active layer of the transistor 123 functioning as a memory element. Alternatively, for the active layer of the transistor 123, instead of the oxide semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. The use of oxide semiconductor films for active layers of all the transistors in the memory cell 105 makes it possible to simplify a manufacturing process. Further, for example, the active layer of the transistor 123 functioning as a memory element is formed using a semiconductor material such as polycrystalline silicon or single crystal silicon which provides higher mobility than an oxide semiconductor, whereby data can be read from the memory cell 105 at high speed.

Figure 3A:
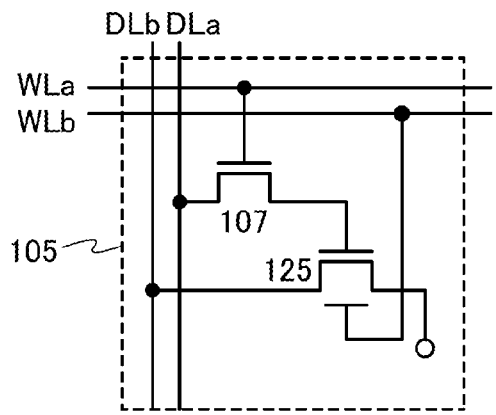
FIGS. 3A to 3D are circuit diagrams of memory cells.

The memory cell 105 illustrated in FIG. 3A includes the transistor 107 functioning as a switching element and a transistor 125 functioning as a memory element. The transistor 125 includes a pair of gate electrodes between which an active layer is provided. One of the pair of gate electrodes serves as a first gate electrode and the other thereof serves as second gate electrode.

The gate electrode of the transistor 107 is connected to the first word line WLa. The first terminal of the transistor 107 is connected to the first data line DLa and the second terminal thereof is connected to the first gate electrode of the transistor 125. The second gate electrode of the transistor 125 is connected to the second word line WLb. A first terminal of the transistor 125 is connected to the second data line DLb, and a second terminal thereof is connected to a node to which a predetermined potential is applied.

In the memory cell 105 illustrated in FIG. 3A, the transistor 107 is turned on at the time of data writing, so that a potential of a signal including data is supplied from the first data line DLa to the first gate electrode of the transistor 125 via the transistor 107. The amount of charge accumulated in a gate capacitance of the transistor 125 is controlled in accordance with the potential of the signal, so that data is written to the transistor 125.

When data is retained, the transistor 107 is turned off, so that the charge accumulated in the gate capacitance of the transistor 125 is retained. As described above, the transistor 107 has a characteristic of extremely low off-state current or extremely low leakage current. Therefore, the accumulated charge is difficult to leak, and thus, the data can be retained for a long period of time as compared to the case where a semiconductor material such as silicon is used for the transistor 107.

At the time of data reading, the potential of the second word line WLb is changed to change the potential of the second gate electrode of the transistor 125. A threshold voltage of the transistor 125 is changed depending on the amount of charge accumulated in the gate capacitance of the transistor 125. Therefore, a difference in the amount of accumulated charge is read from the amount of a drain current of the transistor 125 which is obtained through the change in the potential of the second gate electrode of the transistor 125, and as a result, data can be read.

Note that, an oxide semiconductor film may be used for the active layer of the transistor 125 functioning as a memory element. Alternatively, for the active layer of the transistor 125, instead of the oxide semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. The use of oxide semiconductor films for active layers of all the transistors in the memory cell 105 makes it possible to simplify a manufacturing process. Further, for example, the active layer of the transistor 125 functioning as a memory element is formed using a semiconductor material such as polycrystalline silicon or single crystal silicon which provides higher mobility than an oxide semiconductor, whereby data can be read from the memory cell 105 at high speed.

Figure 3B:
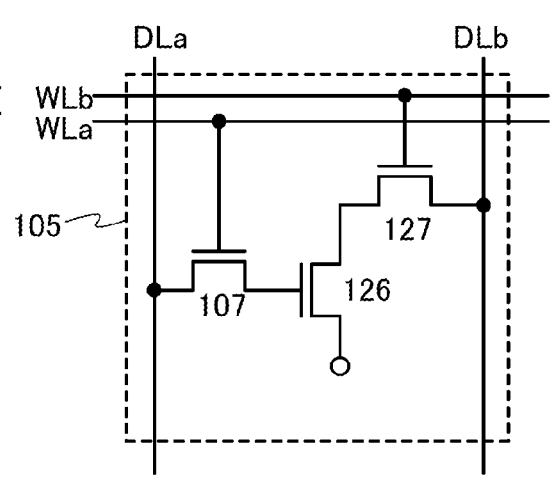

The memory cell 105 illustrated in FIG. 3B includes the transistor 107 functioning as a switching element, a transistor 126 functioning as a memory element, and a transistor 127 functioning as a switching element for controlling data reading. The gate electrode of the transistor 107 is connected to the first word line WLa. The first terminal of the transistor 107 is connected to the first data line DLa and the second terminal thereof is connected to a gate electrode of the transistor 126. A first terminal of the transistor 126 is connected to a second terminal of the transistor 127 and a second terminal of the transistor 126 is connected to a node to which a predetermined potential is applied. A first terminal of the transistor 127 is connected to the second data line DLb. A gate electrode of the transistor 127 is connected to the second word line WLb.

In the memory cell 105 illustrated in FIG. 3B, the transistor 107 is turned on at the time of data writing, so that a potential of a signal including data is supplied from the first data line DLa to the gate electrode of the transistor 126 via the transistor 107. The amount of charge accumulated in a gate capacitance of the transistor 126 is controlled in accordance with the potential of the signal, so that data is written to the transistor 126.

When data is retained, the transistor 107 is turned off, so that the charge accumulated in the gate capacitance of the transistor 126 is retained. As described above, the transistor 107 has a characteristic of extremely low off-state current or extremely low leakage current. Therefore, the accumulated charge is difficult to leak, and thus, data can be held for a long period of time as compared to the case where a semiconductor material such as silicon is used.

At the time of data reading, the potential of the second word line WLb is changed, so that the transistor 127 is turned on. When the transistor 127 is turned on, a drain current having an amount corresponding to the amount of charge accumulated in its gate capacitance flows through the transistor 126. Therefore, a difference in the amount of accumulated charge is read from the amount of the drain current of the transistor 126, so that data can be read.

Note that an oxide semiconductor film may be used for an active layer of the transistor 126 or the transistor 127. Alternatively, for the active layer of the transistor 126 or the transistor 127, instead of the oxide semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. The use of oxide semiconductor films for active layers of all the transistors in the memory cell 105 makes it possible to simplify a manufacturing process. Further, for example, the active layer of the transistor 126 or the transistor 127 is formed using a semiconductor material such as polycrystalline silicon or single crystal silicon which provides higher mobility than an oxide semiconductor, so that data can be read from the memory cell 105 at high speed.

Figure 3C:
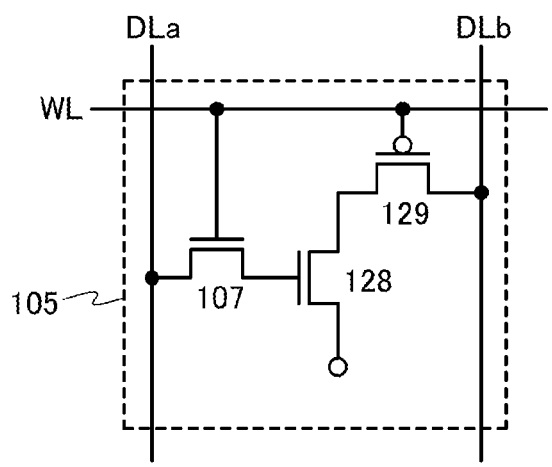

The memory cell 105 illustrated in FIG. 3C is different from the memory cell 105 illustrated in FIG. 3B in that one word line WL has functions of the first word line WLa and the second word line WLb. Specifically, the memory cell 105 illustrated in FIG. 3C includes the transistor 107 functioning as a switching element, a transistor 128 functioning as a memory element, and a transistor 129 functioning as a switching element for controlling data reading. The transistor 129 has a different polarity from the transistor 128. The gate electrode of the transistor 107 is connected to the word line WL. The first terminal of the transistor 107 is connected to the first data line DLa and the second terminal thereof is connected to a gate electrode of the transistor 128. A first terminal of the transistor 128 is connected to a second terminal of the transistor 129 and a second terminal thereof is connected to a node to which a predetermined potential is applied. A first terminal of the transistor 129 is connected to the second data line DLb. A gate electrode of the transistor 129 is connected to the word line WL.

Operation such as writing, retention, and reading of data can be performed in the memory cell 105 illustrated in FIG. 3C in a manner similar to that in the memory cell 105 illustrated in FIG. 3B.

Note that an oxide semiconductor film may be used for an active layer of the transistor 128. Alternatively, for the active layer of the transistor 128, instead of the oxide semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. Further, for example, the active layer of the transistor 128 is formed using a semiconductor material such as polycrystalline silicon or single crystal silicon which provides higher mobility than an oxide semiconductor, so that data can be read from the memory cell 105 at high speed.

Figure 3D:
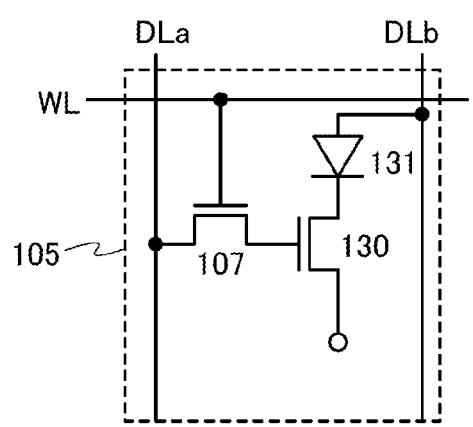

The memory cell 105 illustrated in FIG. 3D includes the transistor 107 functioning as a switching element, a transistor 130 functioning as a memory element, and a diode 131 for controlling data reading. The gate electrode of the transistor 107 is connected to the word line WL. The first terminal of the transistor 107 is connected to the first data line DLa and the second terminal thereof is connected to a gate electrode of the transistor 130. A first terminal of the transistor 130 is connected to a cathode of the diode 131 and a second terminal thereof is connected to a node to which a predetermined potential is applied. An anode of the diode 131 is connected to the second data line DLb.

In the memory cell 105 illustrated in FIG. 3D, the transistor 107 is turned on at the time of data writing, so that a potential of a signal including data is supplied from the first data line DLa to the gate electrode of the transistor 130 via the transistor 107. The amount of charge accumulated in a gate capacitance of the transistor 130 is controlled in accordance with the potential of the signal, so that data is written to the transistor 130. Note that at the time of data writing, the potential of the second data line DLb is kept equal to or lower than the predetermined potential.

Then, at the time of data retention, the transistor 107 is turned off. The potential of the second data line DLb is also kept equal to or lower than the predetermined potential at the time of data retention. Thus, the charge accumulated in the gate capacitance of the transistor 130 is retained. As described above, the transistor 107 has a characteristic of an extremely low off-state current or an extremely low leakage current. Therefore, the accumulated charge is difficult to leak, and thus, the data can be retained for a long period of time as compared to the case where a semiconductor material such as silicon is used for the transistor 107.

At the time of data reading, the potential of the second data line DLb is set to higher than the predetermined potential. A threshold voltage of the transistor 130 is changed depending on the amount of charge accumulated in the gate capacitance of the transistor 130. Therefore, a difference in the amount of accumulated charge is read from the amount of a drain current of the transistor 130 which is obtained through the change in the potential of the gate electrode of the transistor 130, so that data can be read.

Note that, an oxide semiconductor film may be used for an active layer of the transistor 130 functioning as a memory element. Alternatively, for the active layer of the transistor 130, instead of the oxide semiconductor, any of the following semiconductors may be used: amorphous silicon, microcrystalline silicon, polycrystalline silicon, single crystal silicon, amorphous germanium, microcrystalline germanium, polycrystalline germanium, single crystal germanium, or the like. The use of oxide semiconductor films for active layers of all the transistors in the memory cell 105 makes it possible to simplify a manufacturing process. Further, for example, the active layer of the transistor 130 functioning as a memory element is formed using a semiconductor material such as polycrystalline silicon or single crystal silicon which provides higher mobility than an oxide semiconductor, so that data can be read from the memory cell 105 at high speed.

Then, examples of the structure of a memory device including a plurality of memory cells and a method for driving the memory device are described.

Figure 4:
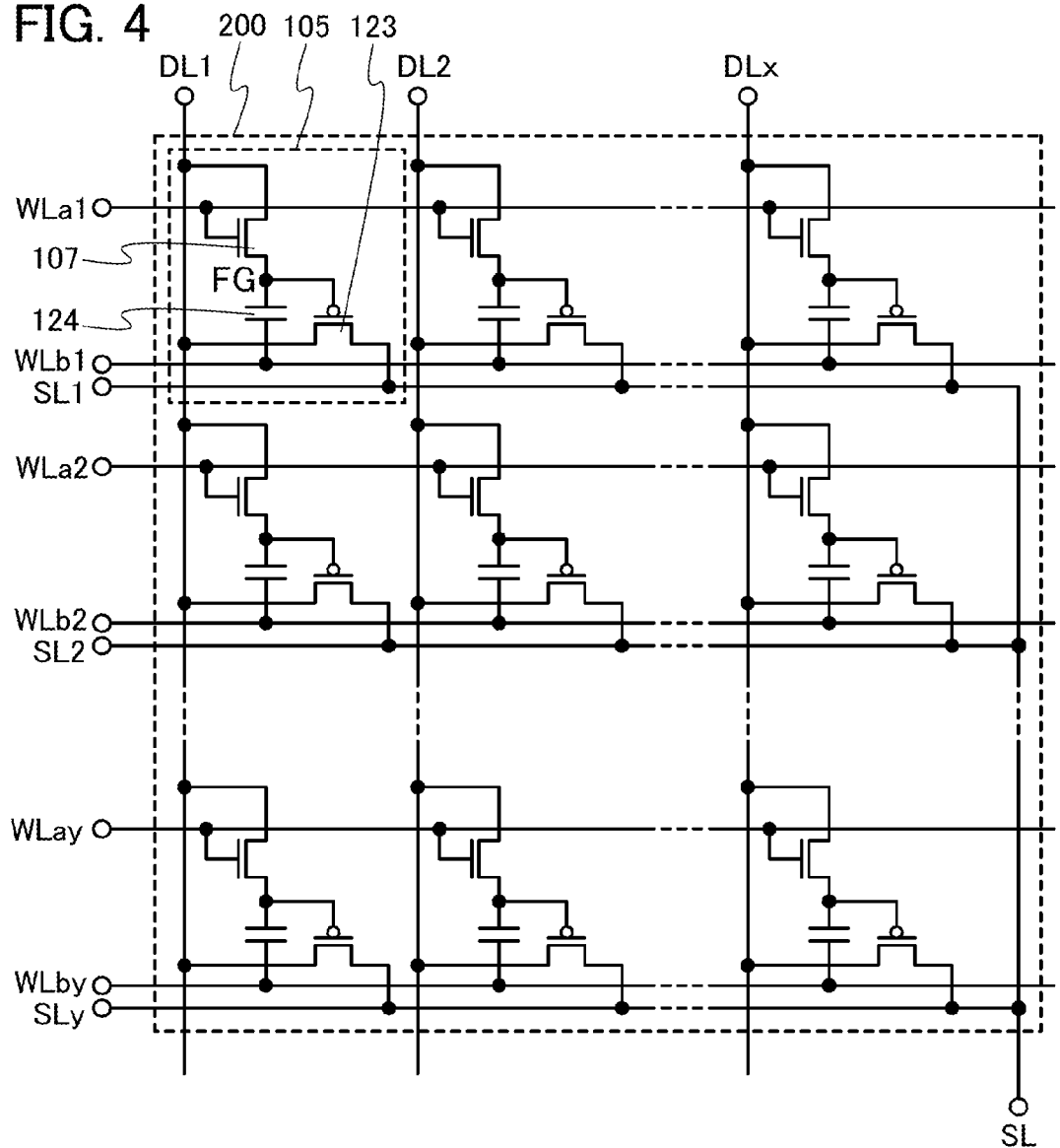
FIG. 4 is a circuit diagram of a cell array.

FIG. 4 is an example of a circuit diagram of a cell array 200 including the plurality of memory cells 105 one of which is illustrated in FIG. 2C. Unlike FIG. 2C, FIG. 4 illustrates an example of a circuit diagram in which the transistor 123 is a p-channel transistor.

In the cell array 200 illustrated in FIG. 4, a variety of wirings such as a plurality of first word lines WLa, a plurality of data lines DL, a plurality of second word lines WLb, and a plurality of source lines SL are provided, and a signal or a potential from a driver circuit is supplied to each of the memory cells 105 via the wirings. The source line SL is connected to a second terminal of the transistor 123.

Note that the number of the wirings can be determined by the number of the memory cells 105 and arrangement of the memory cells 105. Specifically, in the case of the cell array 200 illustrated in FIG. 4, the memory cells 105 are arranged in a matrix of y rows by x columns, and first word lines WLa1 to WLay, second word lines WLb1 to WLby, source lines SL1 to SLy, and data lines DL1 to DLx are provided in the cell array 200.

Next, the operation of the cell array 200 illustrated in FIG. 4 is described with reference to a timing chart in FIG. 5. Note that FIG. 5 illustrates the case where writing, retention, and reading of data are performed on the memory cell 105 in a first row and a first column, the memory cell 105 in the first row and an x-th column, the memory cell 105 in a y-th row and the first column, and the memory cell 105 in the y-th row and the x-th column FIG. 5 illustrates the case where the transistor 123 is a p-channel transistor.

Figure 5:
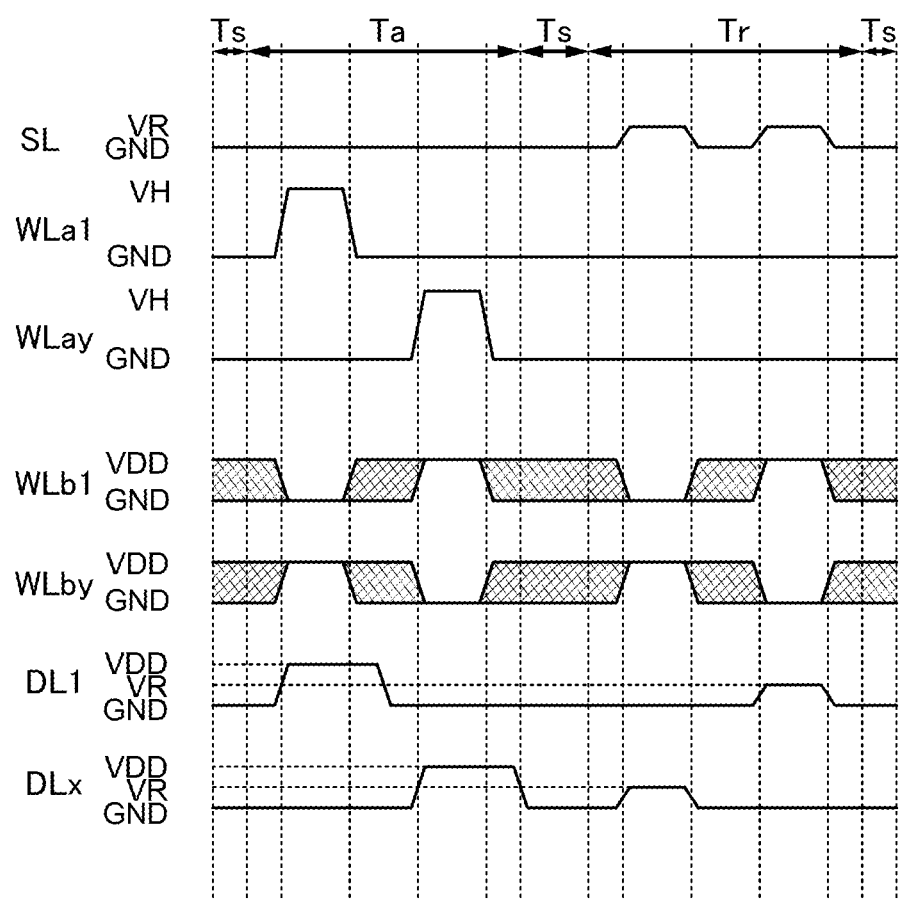
FIG. 5 is a timing chart showing an operation of a memory device.

Note that the shaded areas in the timing chart in FIG. 5 indicate periods during which a potential may be either a high-level potential or a low-level potential.

First, the operation of the cell array 200 in a data writing period Ta is described.

Data is written row by row. In FIG. 5, data is written to the memory cell in the first row and the first column and the memory cell in the first row and the x-th column, and then, data is written to the memory cell in the y-th row and the first column and the memory cell in the y-th row and the x-th column.

First, the first word line WLa1 and the second word line WLb1 in the memory cells 105 in the first row to which data is written are selected. Specifically, in FIG. 5, the high-level potential VH is applied to the first word line WLa1, and the ground potential GND is applied to the first word lines WLa2 to WLay. Thus, only the transistors 107 whose gate electrodes are connected to the first word line WLa1 are selectively turned on. Further, the ground potential GND is applied to the second word line WLb1, and the high-level potential VDD is applied to the other second word lines WLb2 to WLby.

In a period during which the first word line WLa1 and the second word line WLb1 are selected, potentials of signals including data are applied to the data lines DL1 and DLx. Needless to say, the levels of the potentials supplied to the data lines DL1 and DLx are varied depending on the content of the data. FIG. 5 illustrates the case where the high-level potential VDD is applied to the data line DL1 and the ground potential GND is applied to the data line DLx. The potentials applied to the data lines DL1 and DLx are applied to one electrode of the capacitor 124 and the gate electrode of the transistor 123 via the transistors 107 that are on. When a node where the one electrode of the capacitor 124 and the gate electrode of the transistor 123 are connected to each other is referred to as a node FG, the amount of charge accumulated in the node FG is controlled in accordance with the potentials of the signals, so that data is written to the memory cell 105 in the first row and the first column and the memory cell 105 in the first row and the x-th column.

Then, the ground potential GND is applied to the first word line WLa1, and the transistors 107 whose gate electrodes are connected to the first word line WLa1 are turned off.

Then, the first word line WLay and the second word line WLby in the memory cells 105 in the y-th row to which data is written are selected. Specifically, in FIG. 5, the high-level potential VH is applied to the first word line WLay, and the ground potential GND is applied to the first word lines WLa1 to WLa(y−1). Thus, only the transistors 107 whose gate electrodes are connected to the first word line WLay are selectively turned on. The ground potential GND is applied to the second line WLby, and the high-level potential VDD is applied to the second word lines WLb1 to WLb (y−1).

In a period during which the first word line WLay and the second line WLby are selected, potentials of signals including data are applied to the data lines DL1 and DLx. FIG. 5 illustrates the case where the ground potential GND is applied to the data line DL1 and the high-level potential VDD is applied to the data line DLx. The potentials applied to the data lines DL1 and DLx are applied to one electrode of the capacitor 124 and the gate electrode of the transistor 123 via the transistors 107 that are on. The amount of charge accumulated in the node FG is controlled in accordance with the potentials of the signals, so that data is written to the memory cell 105 in the y-th row and the first column and the memory cell 105 in the y-th row and the x-th column.

Note that in the writing period Ta, the ground potential GND is applied to all the source lines SL. With the above structure, in the case where the ground potential GND is applied to the node FG, generation of current in the data line DL and the source line SL can be suppressed.

In order to prevent writing of erroneous data to the memory cell 105, it is preferable to terminate a period during which the potential of the signal including data is input to the data line DL after a selection period of the first word line WLa and the second word line WLb is terminated.

Then, the operation of the cell array 200 in a data retention period Ts is described.

In the retention period Ts, a potential at which the transistor 107 is turned off, specifically, the ground potential GND is applied to all the first word lines WLa. In one embodiment of the present invention, the transistor 107 has extremely low off-state current as described above. When the off-state current of the transistor 107 is low, the charge accumulated in the node FG is less likely to leak; thus, data can be retained for a long time.

Then, the operation of the cell array 200 in a data reading period Tr is described.

First, the second word line WLb1 in the memory cells 105 in the first row on which reading is performed is selected. Specifically, in FIG. 5, the ground potential GND is applied to the second word line WLb1, and the high-level potential VDD is applied to the second word lines WLb2 to WLby. In the reading period Tr, all the first word lines WLa are not selected by application of the ground potential GND. In a period during which the second word line WLb 1 is selected, a high-level potential VR is applied to all the source lines SL. Note that the potential VR is equal to the potential VDD, or lower than the potential VDD and higher than the ground potential GND.

Resistance between the source electrode and the drain electrode of the transistor 123 depends on the amount of charge accumulated in the node FG. Thus, a potential based on the amount of charge accumulated in the node FG is applied to the data lines DL1 and DLx. Then, by reading a difference in the amount of charge from the potential, data can be read from the memory cell 105 in the first row and the first column and the memory cell 105 in the first row and the x-th column.

Then, the second word line WLby in the memory cells 105 in the y-th row from which data is read is selected. Specifically, in FIG. 5, the ground potential GND is applied to the second word line WLby, and the high-level potential VDD is applied to the second word lines WLb1 to WLb(y−1). As described above, in the reading period Tr, all the first word lines WLa are not selected by application of the ground potential GND. In a period during which the second word line WLby is selected, the high-level potential VR is applied to all the source lines SL.

Resistance between the source electrode and the drain electrode of the transistor 123 depends on the amount of charge accumulated in the node FG. Thus, a potential based on the amount of charge accumulated in the node FG is applied to the data lines DL1 and DLx. Then, by reading a difference in the amount of charge from the potential, data can be read from the memory cell 105 in the y-th row and the first column and the memory cell 105 in the y-th row and the x-th column.

Note that a reading circuit is connected to an end of each data line DL, and a signal output from the reading circuit includes data which is actually read from the cell array 200.

Then, different examples of the structure of a memory device including a plurality of memory cells and a method for driving the memory device are described.

Figure 6:
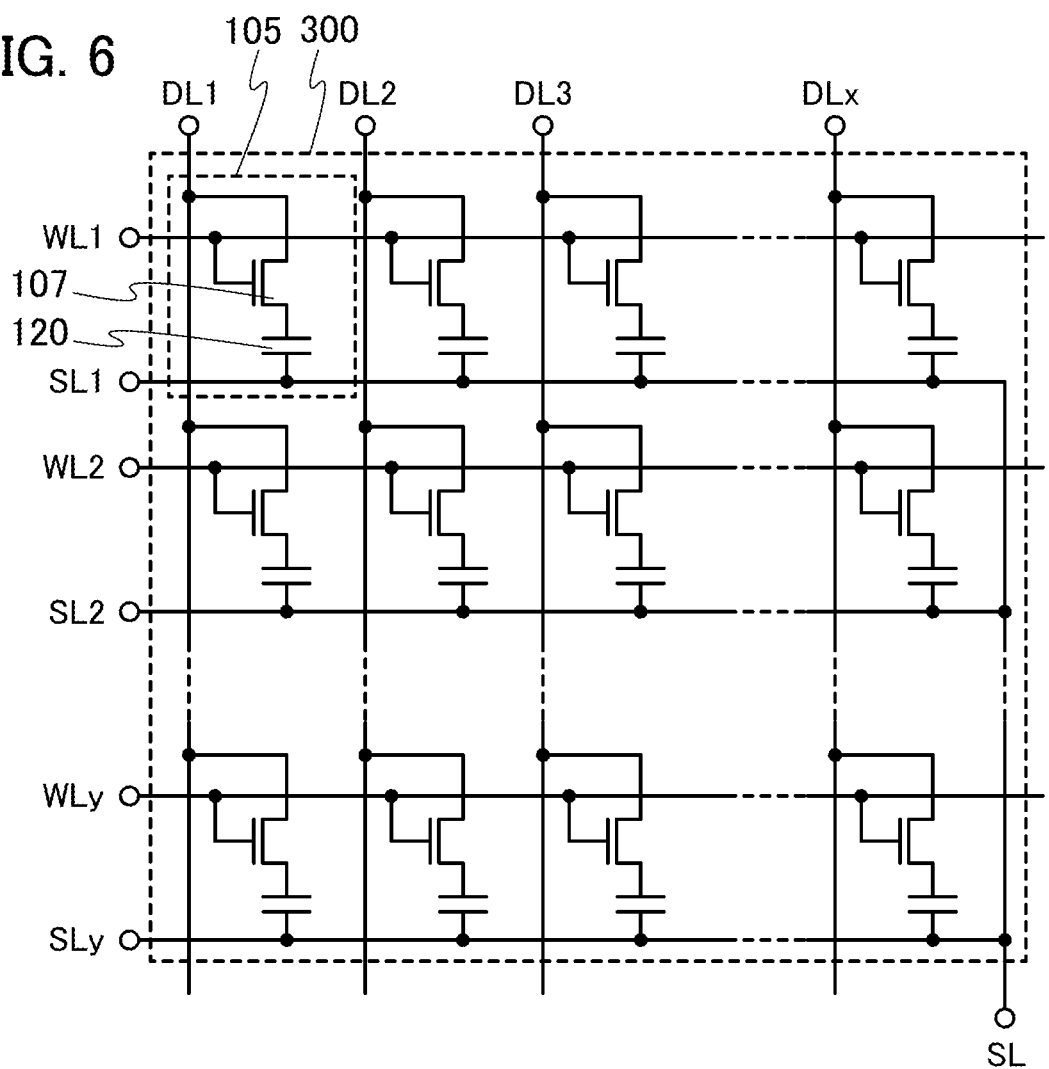
FIG. 6 is a circuit diagram of a cell array.

FIG. 6 is an example of a circuit diagram of a cell array 300 including the plurality of memory cells 105 one of which is illustrated in FIG. 2A.

In the cell array 300 illustrated in FIG. 6, a variety of wirings such as a plurality of word lines WL, a plurality of data lines DL, and a plurality of source lines SL are provided, and a signal or a potential from a driver circuit is supplied to each memory cell 105 via the wirings. The source line SL is connected to the other electrode of the capacitor 120 and supplied with the ground potential.

Note that the number of the wirings can be determined by the number of the memory cells 105 and arrangement of the memory cells 105. Specifically, in the cell array 300 illustrated in FIG. 6, memory cells are arranged in a matrix of y rows by x columns, and the word lines WL1 to WLy, the data lines DL1 to DLx, the source lines SL1 to SLy are provided in the cell array 300.

Next, the operation of the cell array 300 illustrated in FIG. 6 is described.

First, the operation of the cell array 300 in a data writing period is described. In the writing period, when a signal with a pulse is input to the word line WL1, the potential of the pulse, specifically, a high-level potential, is applied to gate electrodes of the transistors 107 connected to the word line WL1. Thus, all the transistors 107 whose gate electrodes are connected to the word line WL1 are turned on.

Then, signals including data are input to the data lines DL1 to DLx. Needless to say, the levels of the potentials of the signals input to the data lines DL1 to DLx are varied depending on the content of data. The potentials input to the data lines DL1 to DLx are each applied, via the transistor 107 which is on, to one of electrodes of the capacitor 120. The amount of accumulated in the capacitor 120 is controlled in accordance with the potential of the signal, so that data is written into the capacitor 120.

When the input of the signal with the pulse to the writing word line WL1 is finished, all the transistors 107 whose gate electrodes are connected to the writing word line WL1 are turned off. The signal with pulse is input to the word lines WL2 to WLy in sequence, and the above operation is repeated in the memory cells 105 including the word lines WL2 to WLy.

Then, the operation of the cell array 300 in a data retention period is described. In the retention period, potentials with levels at which the transistor 107 is turned off, specifically, low-level potentials, are applied to all of the word lines WL1 to WLy. In one embodiment of the present invention, the off-state current of the transistor 107 is extremely low as described above. When the off-state current of the transistor 107 is low, the charge accumulated in the capacitor 120 is less likely to leak; thus, data can be retained for a long time.

Then, the operation of the cell array 300 in a data reading period is described. In the data reading period, a signal with pulse is sequentially input to the word lines WL1 to WLy in a manner similar to that in the data writing period. When the potential of the pulse, specifically, a high-level potential, is applied to the gate electrodes of the transistors 107 which are connected to the word line WL1, the transistors 107 connected to the word line WL1 are turned on.

When the transistors 107 are turned on, charge accumulated in the capacitors 120 is taken out via the data lines DL. By reading a difference in the amount of charge from the potential of the data line DL, data can be read.

Note that a reading circuit is connected to an end of each data line DL, and a signal output from the reading circuit includes data which is actually read from the memory portion.

Although in this embodiment, a driving method in which writing, retention, and reading of data are sequentially performed in the plurality of memory cells 105 is described, the present invention is not limited to this structure. Only a memory cell 105 with the specified address may perform the above operation.

Note that the memory device included in the signal processing circuit according to one embodiment of the present invention is not limited to the structures of the memory cell 105 illustrated in FIG. 4 and FIG. 6.

Note that in the memory device included in the signal processing circuit according to one embodiment of the present invention, different data can be written so that data which has been written is overwritten. Thus, unlike a conventional flash memory, erasing of data which has been written is not needed at the time of rewriting data, which is one of advantages.

In the case of a general flash memory, a floating gate in which electrical charge is accumulated is covered with an insulating film and in an insulating state. Accordingly, a high voltage of approximately 20 V needs to be applied to a memory element in order that electric charge may be accumulated in the floating gate by the use of a tunnel effect. Further, it takes long time to perform data writing. However, in the memory device included in the signal processing circuit according to one embodiment of the present invention, data can be written and read by a transistor including a highly-purified oxide semiconductor film as an active layer. Accordingly, a voltage of several volts needed for operation of the memory device, so that power consumption can be remarkably reduced. Further, data writing can be performed at higher speed than that in the case of a flash memory.

Further, in a signal processing circuit including a general flash memory, since voltage needed for operation (operating voltage) of the flash memory is high, voltage applied to the flash memory is usually raised with the use of a step-up circuit or the like. However, since the operation voltage of the memory device can be lowered in the signal processing circuit according to one embodiment of the present invention, it is possible to reduce power consumption. Accordingly, a load of an external circuit used for operation of the memory device, such as a step-up dc-dc converter, in the signal processing circuit can be decreased, so that the functions of the external circuit are expanded, and the higher performance of the signal processing circuit can be realized. Further, the operation voltage of the memory device can be lowered, so that redundant circuit design which is needed to cover a failure caused by high operation voltage is unnecessary; therefore, the integration degree of an integrated circuit used for the signal processing circuit can be increased, and a higher-performance signal processing circuit can be formed.

Further, in this embodiment, although the driving method when binary digital data is used is described, the memory device included in the signal processing circuit according to one embodiment of the present invention can also use multi-valued data that has three or more values. Note that in the case of multi-valued data that has three or more values, a difference between the amounts of charge becomes smaller as the number of values is increased to four, five, and six, for example. Thus, if a slight amount of off-state current exists, it is difficult to maintain the accuracy of data, and a retention period tends to be shorter. However, in the memory device included in the signal processing circuit according to one embodiment of the present invention, since the transistor whose off-state current is considerably reduced is used as a switching element, shortening of a retention period due to value multiplexing can be suppressed.

Embodiment 2

An example of a specific structure of a driver circuit in a memory device will be described.

Figure 7:
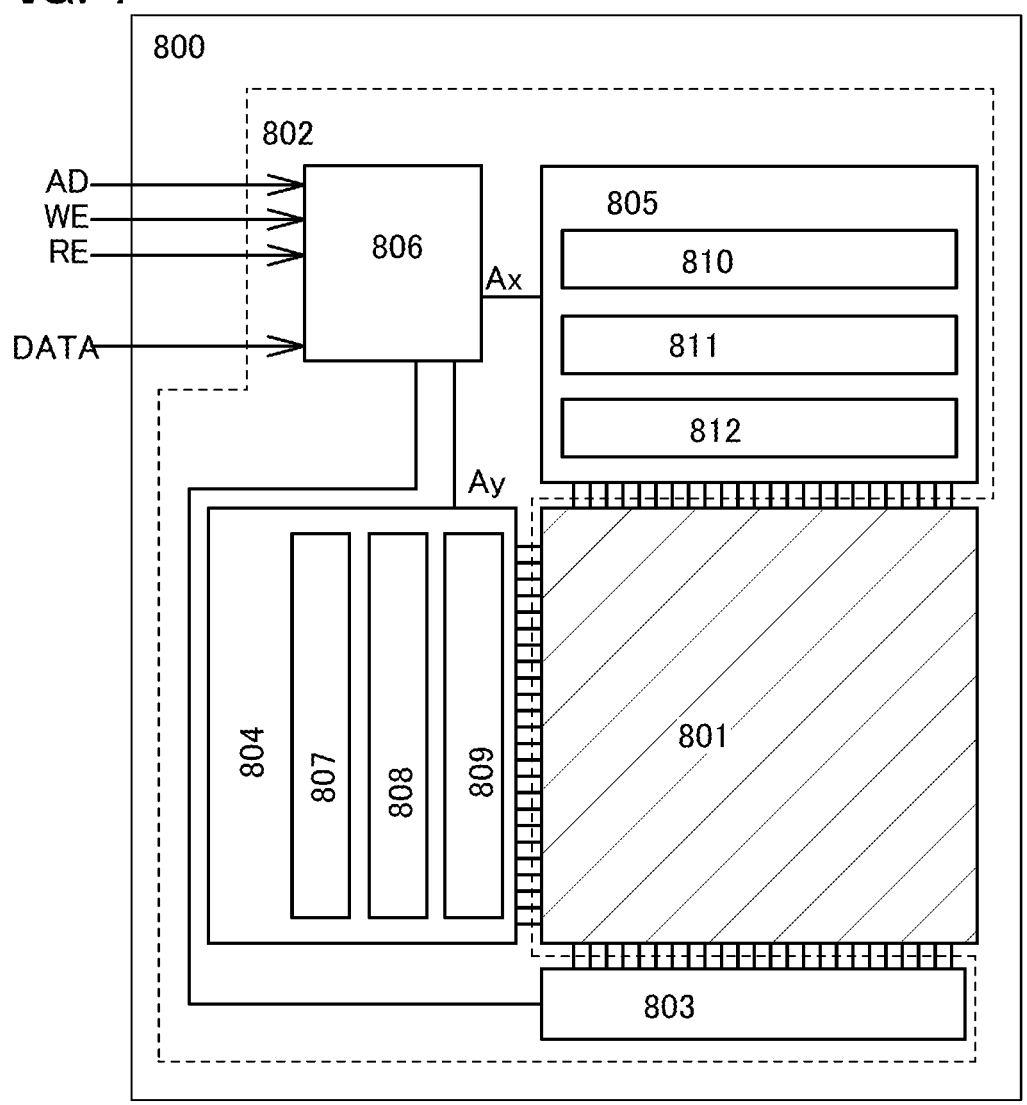
FIG. 7 is a block diagram illustrating a structure of a memory device.

FIG. 7 is, as an example, a block diagram of a specific structure of a memory device. Note that in the block diagram in FIG. 7, circuits in the memory device are classified in accordance with their functions and separated blocks are illustrated. However, it is difficult to classify actual circuits according to their functions completely and it is possible for one circuit to have a plurality of functions.

A memory device 800 illustrated in FIG. 7 includes a cell array 801 and a driver circuit 802. The driver circuit 802 includes a reading circuit 803 which generates a signal including data read from the cell array 801, a word line driver circuit 804 which controls the potential of a first word line or a second word line, and a data line driver circuit 805 which controls data writing in a memory cell selected in the cell array 801. The driver circuit 802 further includes a control circuit 806 which controls the operations of the reading circuit 803, the word line driver circuit 804, and the data line driver circuit 805.

In the memory device 800 illustrated in FIG. 7, the word line driver circuit 804 includes a decoder 807, a level shifter 808, and a buffer 809. The data line driver circuit 805 includes a decoder 810, a level shifter 811, and a selector 812.

Note that the cell array 801, the reading circuit 803, the word line driver circuit 804, the data line driver circuit 805, and the control circuit 806 may be formed using one substrate; any one of them may be formed using a substrate different from a substrate for the others; or all of them may be formed using different substrates.

In the case where different substrates are used, electrical connection between the above circuits can be ensured with the use of an FPC (flexible printed circuit) or the like. In that case, part of the driver circuit 802 may be connected to an FPC by a COF (chip on film) method. Further, electrical connection can be ensured by a COG (chip on glass) method.

When a signal AD including an address (Ax, Ay) of the cell array 801 as data is input to the memory device 800, the control circuit 806 transmits Ax which is data related to a column direction in the address and Ay which is data related to a row direction in the address to the data line driver circuit 805 and the word line driver circuit 804, respectively. In addition, the control circuit 806 transmits a signal DATA including data input to the memory device 800 to the data line driver circuit 805.

Operation of writing data and operation of reading data in the cell array 801 are selected in accordance with a signal RE (read enable), a signal WE (write enable), or the like supplied to the control circuit 806. Further, in the case where the plurality of cell arrays 801 are provided, a signal CE (chip enable) for selecting the cell array 801 may be input to the control circuit 806. In that case, operation selected in accordance with the signal RE or the signal WE is performed in the cell array 801 selected in accordance with the signal CE.

In the cell array 801, when the writing operation is selected in accordance with the signal WE, a signal for selecting a memory cell corresponding to the address Ay is generated in the decoder 807 included in the word line driver circuit 804 in response to an instruction from the control circuit 806. The amplitude of the signal is adjusted by the level shifter 808, and then the waveform of the signal is processed in the buffer 809 and the processed signal is input to the cell array 801. In the data line driver circuit 805, a signal for selecting a memory cell corresponding to the address Ax among the memory cells selected in the decoder 810 is generated in response to an instruction from the control circuit 806. The amplitude of the signal is adjusted by the level shifter 811, and then the processed signal is input to the selector 812. In the selector 812, the signal DATA is sampled in accordance with the input signal, and the sampled signal is input to a memory cell corresponding to the address (Ax, Ay).

In the cell array 801, when the reading operation is selected in accordance with the signal RE, a signal for selecting a memory cell corresponding to the address Ay is generated in the decoder 807 included in the word line driver circuit 804 in response to an instruction from the control circuit 806. The amplitude of the signal is adjusted by the level shifter 808, and then the waveform of the signal is processed in the buffer 809 and the processed signal is input to the cell array 801. In the reading circuit 803, a signal for selecting a memory cell corresponding to the address Ax among the memory cells selected in the decoder 807 is generated in response to an instruction from the control circuit 806. Data stored in the memory cell corresponding to the address (Ax, Ay) is read, and a signal including the data is generated.

This embodiment can be implemented by being combined as appropriate with any of the above embodiments.

Embodiment 3

In this embodiment, an example of a specific structure of a reading circuit will be described.

The levels of potentials read from the cell array are determined in accordance with data written to the memory cells. Accordingly, in an ideal view, potentials having the same level should be read from the plurality of memory cells when data with the same digital value is stored in the plurality of memory cells. However, practically, the characteristics of transistors functioning as memory elements or transistors functioning as switching elements at the time of reading data might be varied among the memory cells. In that case, the potentials which are actually read are varied even if all of data to be read has the same digital value, so that the levels of the potentials can be widely distributed. Thus, it is preferable to provide, in the driver circuit, a reading circuit in which a signal including more accurate data and having an amplitude and a waveform processed in accordance with a desired specification can be generated even when potentials read from the cell array are slightly varied.

Figure 8:
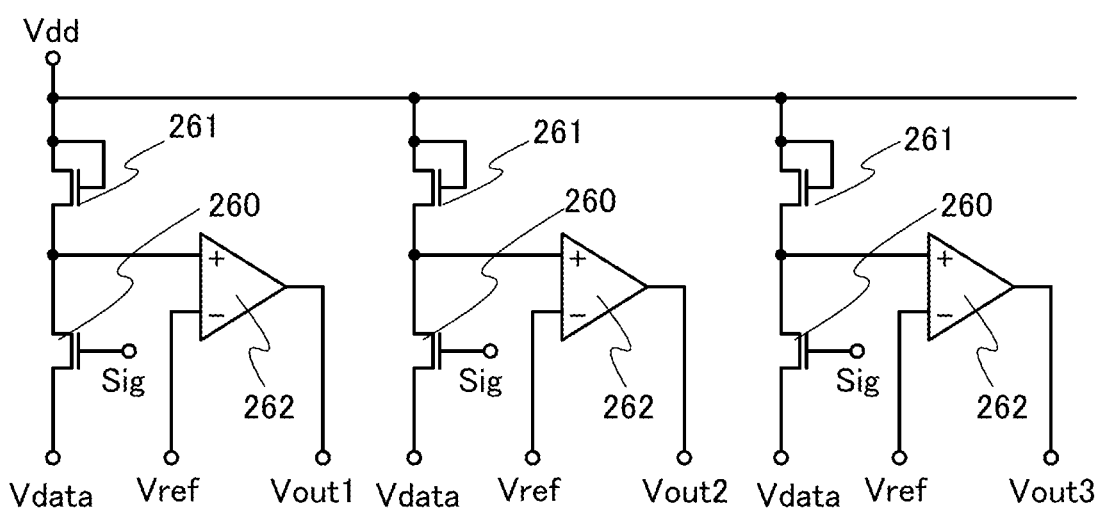
FIG. 8 is a diagram illustrating a structure of a reading circuit.

FIG. 8 illustrates an example of a circuit diagram of a reading circuit. The reading circuit illustrated in FIG. 8 includes transistors 260 serving as switching elements for controlling the input of potentials Vdata read from a cell array to the reading circuit, and transistors 261 serving as resistors. In addition, the reading circuit in FIG. 8 includes operational amplifiers 262.

Specifically, gate electrodes of the transistors 261 are connected to respective drain electrodes (or drain regions) of the transistors 261. In addition, a high-level power supply potential Vdd is applied to the gate electrodes and the drain electrodes. Further, source electrodes of the transistors 261 are connected to respective non-inverting input terminals (+) of the operational amplifiers 262. Accordingly, the transistors 261 function as resistors connected between nodes to which the power supply potential Vdd is applied and the non-inverting input terminals (+) of the operational amplifiers 262. Note that although in FIG. 8, a transistor whose gate electrode is connected to the drain electrode is used as a resistor, an embodiment of the present invention is not limited to this. Alternatively, an element functioning as a resistor can be used.

The transistor 260 functioning as a switching element controls the supply of a potential Vdata to a source electrode of the transistor 260 in accordance with a potential of a signal Sig applied to a gate electrode of the transistor 260.

For example, when the transistor 260 is turned on, a potential obtained by resistive division of the potential Vdata and the power supply potential Vdd with the use of the transistor 260 and the transistor 261 is applied to the non-inversion input terminal (+) of the operational amplifier 262. The level of the power supply potential Vdd is fixed; thus, the level of the potential obtained by the resistor division reflects the level of the potential Vdata, i.e., a digital value of read data.

In contrast, a reference potential Vref is applied to inverting input terminals (−) of the operational amplifiers 262. The levels of the potentials Vout of output terminals can be varied depending on the level of the potential applied to the non-inversion input terminal (+) with respect to the reference potential Vref. Thus, a signal which indirectly includes data can be obtained.

Note that even if data with the same value is stored in memory cells, fluctuation in levels of the read potential Vdata occurs due to variation in characteristics of the memory cells, so that the levels of potentials can be widely distributed sometimes. The level of the reference potential Vref is determined in consideration of fluctuation in the potential Vdata of node in order to read the value of data accurately.

Since FIG. 8 illustrates an example of a reading circuit in the case of using a binary digital value, one operational amplifier used for reading data is used for each node to which the potential Vdata is applied. However, the number of operational amplifiers is not limited to this. When n-valued data (n is a natural number of 2 or more) is used, the number of operational amplifiers used for each node to which the potential Vdata is applied is (n−1).

This embodiment can be implemented by being combined as appropriate with any of the above embodiments.

Embodiment 4

Figure 9:
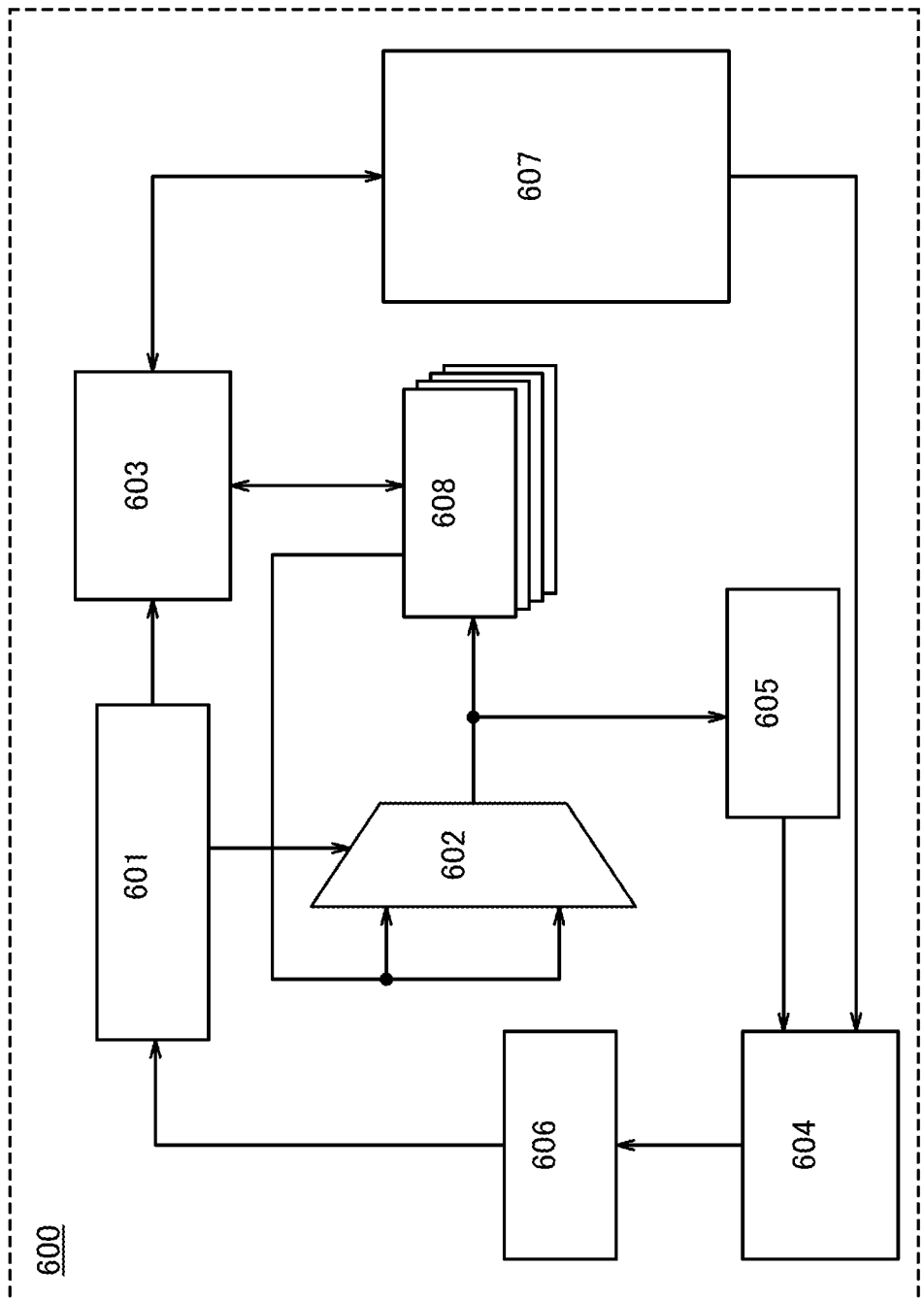
FIG. 9 is a block diagram illustrating a structure of a signal processing circuit.

In this embodiment, a specific embodiment of a signal processing circuit according to the present invention will be described. An example of a structure of the signal processing circuit is illustrated as a block diagram in FIG. 9.

A signal processing circuit 600 includes a control unit 601, an arithmetic logic unit (ALU) 602 corresponding to an arithmetic unit, a data cache 603, an instruction cache 604, a program counter 605, an instruction register 606, a main memory device 607, and a register file 608.

The control unit 601 has a function of decoding and carrying out an input instruction. The ALU 602 has a function of performing a variety of arithmetic operations such as four arithmetic operations and logic operations. The data cache 603 is a buffer memory device which temporary stores frequently-used data. The instruction cache 604 is a buffer memory device which temporary stores frequently-used instructions of instructions (programs) sent to the control unit 601. The program counter 605 is a register which stores an address of an instruction to be carried out next. The instruction register 606 is a register which stores an instruction to be carried out next. Data used for the arithmetic operations in the ALU 602 and an instruction which is carried out in the control unit 601 are stored in the main memory device 607. The register file 608 includes a plurality of registers including a general purpose register and can store data which is read out from the main memory device 607, data which is obtained during the arithmetic operations in the ALU 602, data which is obtained as a result of the arithmetic operations in the ALU 602, and the like.

Next, the operation of the signal processing circuit 600 is described.

The control unit 601 reads an instruction from an address of the instruction cache 604 corresponding to the address of the instruction to be carried out next which is stored in the program counter 605, and makes the instruction register 606 store the instruction. When the instruction is not stored in the corresponding address of the instruction cache 604, the control unit 601 gets access to a corresponding address of the main memory device 607, reads the instruction from the main memory device 607, and makes the instruction register 606 store the instruction. In this case, the instruction is also stored in the instruction cache 604.

The control unit 601 decodes the instruction stored in the instruction register 606 and carries out the instruction. Specifically, the control unit 601 generates various signals for controlling the operation of the ALU 602 in accordance with the instruction.

When the instruction which is to be carried out is an arithmetic instruction, the control unit 601 makes the ALU 602 perform arithmetic operations using the data stored in the register file 608, and stores a result of the arithmetic operations in the register file 608.

When the instruction which is to be carried out is a loading instruction, the control unit 601, first, gets access to a corresponding address of the data cache 603, and checks whether or not a corresponding data exists in the data cache 603. When the data exists in the data cache 603, the corresponding data is copied from the corresponding address of the data cache 603 to the register file 608. When the data does not exist in the data cache 603, the data is copied from a corresponding address of the main memory device 607 to the corresponding address of the data cache 603, and then the data is copied from the corresponding address of the data cache 603 to the register file 608.

When the instruction which is to be carried out is a store instruction, the control unit 601 stores data of the register file 608 in a corresponding address of the data cache 603. In this case, the control unit 601, first, gets access to the corresponding address of the data cache 603 and checks whether or not the corresponding data can be stored in the data cache 603. When the data can be stored in the data cache 603, the data is copied from the register file 608 to the corresponding address of the data cache 603. When the data cannot be stored, a new corresponding address is assigned in part of the data cache 603, and the data is copied from the register file 608 to the corresponding address of the data cache 603. Note that the data may be copied to the main memory device 607 immediately after the data is copied to the data cache 603. Alternatively, some pieces of data may be copied to the data cache 603 and then the pieces of data may be collectively copied to the main memory device 607.

Then, after the control unit 601 carries out the instruction, the control unit 601 gets access to the program counter 605 again, and repeats the above operation in which an instruction read out from the instruction register 606 is decoded and carried out.

In one embodiment of the present invention, the memory device described in the above embodiment is applied to the data cache 603 and the instruction cache 604, whereby erasure of data can be prevented even when power supply is stopped. Accordingly, power supply can be stopped even for a short time in the whole of the signal processing circuit 600, or in the logic circuit such as the control unit 601 or the ALU 602 included in the signal processing circuit 600. Therefore, power consumption of the signal processing circuit 600 can be reduced.

This embodiment can be implemented by being combined as appropriate with any of the above embodiments.

Embodiment 5

A buffer memory device includes a plurality of cache lines each storing a predetermined amount of information. Each of the cache lines includes a memory region referred to as a data field, a memory region referred to as a tag, and a memory region referred to as a valid bit.

Cache data that is data sent from a main memory device or an arithmetic unit is stored in the data field. Address data that is data of an address corresponding to the cache data is stored in the tag. Valid data that is data indicating whether or not the cache data stored in the data field is valid is stored in the valid bit.

FIG. 10 illustrates an example of a structure of the buffer memory device. The buffer memory device illustrated in FIG. 10 includes n cache lines, that is, cache lines 0 to n−1. Each of the cache lines includes the tag, the valid bit, and the data field.

For example, in the case where supply of a power supply voltage to a signal processing circuit is stopped for a long time, when the buffer memory device includes a volatile memory, data stored in the cache line has an undefined value. Therefore, after the supply of the power supply voltage to the signal processing circuit starts, the valid bits of all of the cache lines need to be invalidated. However, during processing for invalidating the valid bits, a control unit and the arithmetic unit need to be in a standby state. Therefore, after the supply of the power supply voltage starts, it takes time until the signal processing circuit actually starts to process a signal.

In the signal processing circuit according to one embodiment of the present invention, data writing can be performed concurrently in all memory cells in the memory device. In other words, it is not necessary to write data of the valid bit in every cache line, and data of the valid bits included in all the cache lines can be written concurrently. Specifically, with the structure in which potentials of all word lines WL or potentials of all first word lines WLa of the memory cells can be controlled concurrently, transistors functioning as switching elements are turned on concurrently, and data of a digital value indicating invalidation is written to all the memory cells. Further, when the transistor functioning as a switching element includes a pair of gate electrodes between which an active layer is provided, and one gate electrode is connected to the word line WL or the first word line WLa, the data of the digital value indicating invalidation may be written in all the memory cells concurrently by controlling a potential of the other gate electrode.

Accordingly, the time needed for invalidating the valid bits can be shortened in the signal processing circuit according to one embodiment of the present invention as compared to a general processing circuit including a memory device in which data needs to be written in every cache line. Therefore, the starting time after the supply of the power supply voltage starts until the signal processing circuit actually starts to process the signal can be shortened.

In particular, when the number of the cache lines becomes larger as the capacity of a buffer memory device is increased, the signal processing circuit according to one embodiment of the invention makes it possible to considerably shorten the starting time as compared to a general signal processing circuit.

For example, an instruction which invalidates all the valid bits in the buffer memory device is prepared in an instruction set of the signal processing circuit. The instruction is stored in an address in the main memory device, to which the control unit gets access first. Further, the buffer memory device is put in a standby state just after the supply of the power supply voltage starts and starts its operation after the invalidation of the valid bits is completed. Specifically, a register indicating the state of the buffer memory device is prepared, and just after the supply of the power supply voltage to the signal processing circuit starts, the register has data indicating the standby state of the buffer memory device.

Since the buffer memory device is in the standby state after the supply of the power supply voltage to the signal processing circuit starts, the control unit gets access to the main memory device. The control unit reads the instruction which invalidates all the valid bits from the main memory device. The control unit decodes the read instruction and carriers it out.

This embodiment can be implemented by being combined as appropriate with any of the above embodiments.

Embodiment 6

In this embodiment, a method for manufacturing a memory device will be described by giving an example in which an oxide semiconductor is used for an active layer of a transistor 107 and silicon is used for an active layer of a transistor 123 in a memory cell 105 illustrated in FIG. 2C.

Besides silicon, a semiconductor material such as germanium, silicon germanium, or single crystal silicon carbide may be used for the transistor 123. For example, the transistor 123 including silicon can be formed using a single crystal semiconductor substrate such as a silicon wafer, a silicon thin film which is formed by an SOI method, a silicon thin film which is formed by a vapor deposition method, or the like. Alternatively, in one embodiment of the present invention, all the transistors included in the memory cells may include an oxide semiconductor.

Figure 11A:
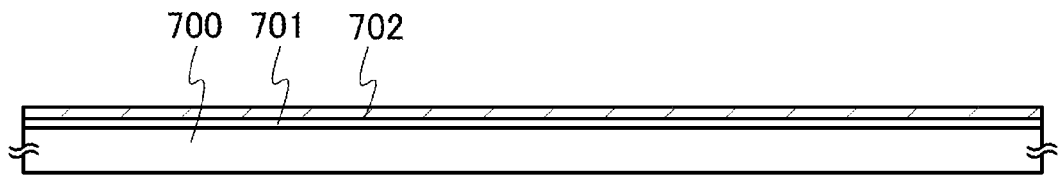
FIGS. 11A to 11D are views illustrating a method for manufacturing a memory device.

In this embodiment, first, as illustrated in FIG. 11A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of the heat treatment to be performed later is high, a glass substrate whose strain point is greater than or equal to 730° C. is preferably used as the glass substrate.

In this embodiment, an example in which the semiconductor film 702 is formed using single crystal silicon is given as a method for forming the transistor 123. Note that a specific example of a method for forming the single crystal semiconductor film 702 is briefly described. First, an ion beam including ions which are accelerated by an electric field enters a bond substrate which is the single crystal semiconductor substrate and an embrittlement layer which is fragile because of local disorder of the crystal structure is formed in a region at a certain depth from a surface of the bond substrate. The depth at which the embrittlement layer is formed can be adjusted by the acceleration energy of the ion beam and the angle at which the ion beam enters. Then, the bond substrate and the substrate 700 which is provided with the insulating film 701 are attached to each other so that the insulating film 701 is provided therebetween. After the bond substrate and the substrate 700 overlap with each other, a pressure of approximately 1 $N/cm^2$ to 500 $N/cm^2$, preferably 11 $N/cm^2$ to 20 $N/cm^2$ is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Subsequently, heat treatment is performed, whereby microvoids that exist in the embrittlement layer are expanded and the microvoids are combined with each other, so that a void with large volume can be obtained. Accordingly, a single crystal semiconductor film which is part of the bond substrate is separated from the bond substrate along the embrittlement layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not patterned or may be added to the patterned semiconductor film 702. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not patterned or the patterned semiconductor film 702 in order to finely control the threshold voltage.

Note that although an example in which a single crystal semiconductor film is used is described in this embodiment, the present invention is not limited to this structure. For example, a polycrystalline, microcrystalline, or amorphous semiconductor film which is formed over the insulating film 701 by a vapor deposition method may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. When a heat-resistant substrate such as a quartz substrate is used, a crystallization method combined with a thermal crystallization method using an electrically heated oven, a lamp annealing crystallization method using infrared light, a crystallization method using a catalytic element, or a high-temperature annealing method at approximately 950° C., may be used.

Figure 11B:
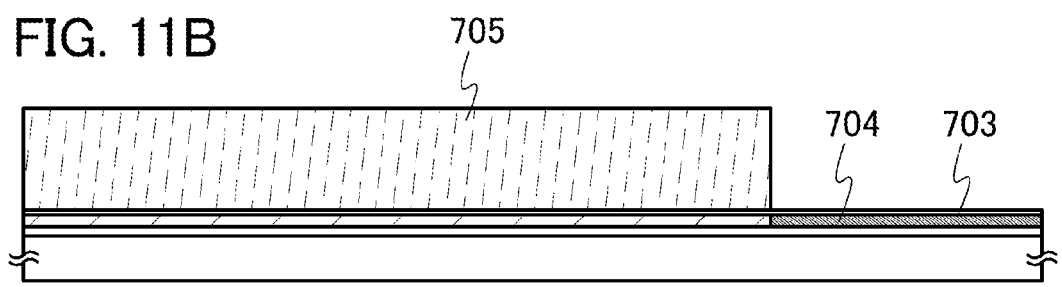

Next, as illustrated in FIG. 11B, a gate insulating film 703 is formed over the semiconductor film 702. Then, a mask 705 is formed over the gate insulating film 703 and an impurity element imparting conductivity is added to part of the semiconductor film 702, so that an impurity region 704 is formed.

The gate insulating film 703 can be formed by oxidation or nitriding of a surface of the semiconductor film 702 by high-density plasma treatment, heat treatment, or the like. The high-density plasma treatment is performed, for example, by using a mixed gas of an inert gas such as He, Ar, Kr, or Xe, and oxygen, nitrogen oxide, ammonia, nitrogen, hydrogen, or the like. In this case, by exciting plasma by introduction of microwaves, plasma with a low electron temperature and high density can be generated. By oxidation or nitriding of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed so as to be in contact with the semiconductor film. For example, a surface of the semiconductor film 702 is oxidized or nitrided using nitrous oxide ($N_2O$) diluted with Ar by 1 times to 3 times (flow ratio) by application of a microwave (2.45 GHz) power of 3 kW to 5 kW at a pressure of 10 Pa to 30 Pa. By this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) electric power of 3 kW to 5 kW is applied with a pressure of 10 Pa to 30 Pa so that a silicon oxynitride film is formed by a vapor deposition method, thereby forming the gate insulating film. With a combination of a solid-phase reaction and a reaction by a vapor deposition method, the gate insulating film with low interface state density and excellent withstand voltage can be formed.

The oxidation or nitriding of the semiconductor film by the high-density plasma treatment proceeds by solid-phase reaction. Thus, interface state density between the gate insulating film 703 and the semiconductor film 702 can be extremely low. Further, by direct oxidation or nitriding of the semiconductor film 702 by high-density plasma treatment, variation in the thickness of the insulating film to be formed can be suppressed. Moreover, in the case where the semiconductor film has crystallinity, the surface of the semiconductor film is oxidized with solid-phase reaction by the high-density plasma treatment to suppress fast oxidation only in a crystal grain boundary; therefore, the gate insulating film with uniformity and low interface state density can be formed. Variations in the characteristics of a transistor whose gate insulating film partly or entirely includes an insulating film formed by high-density plasma treatment can be suppressed.

The gate insulating film 703 may be formed using a single layer or a stack of layers using a film including silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by a plasma CVD method, a sputtering method, or the like.

Note that, in this specification, an oxynitride refers to a material containing a larger amount of oxygen than that of nitrogen, and a nitride oxide compound refers to a material containing a larger amount of nitrogen than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is used as the gate insulating film 703 by a plasma CVD method.

Figure 11C:
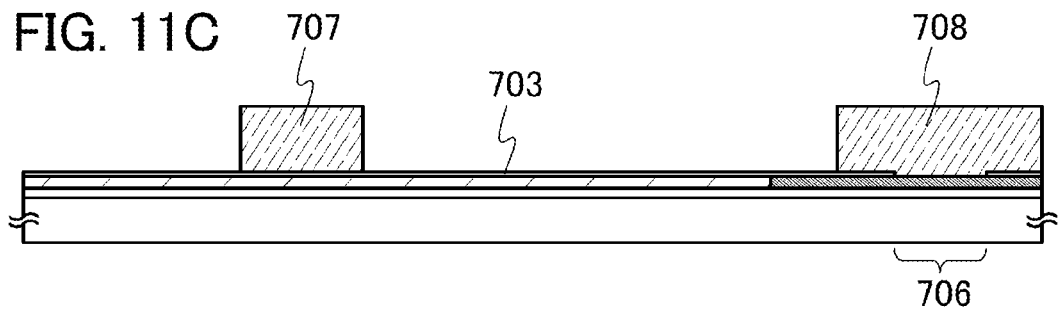

Then, after the mask 705 is removed, part of the gate insulating film 703 is removed as illustrated in FIG. 11C and an opening 706 is formed in a region overlapping with the impurity region 704 by etching or the like. After that, a gate electrode 707 and a conductive film 708 are formed.

A conductive film is formed so as to cover the opening 706 and then is processed (patterned) into a predetermined shape, so that the gate electrode 707 and the conductive film 708 can be formed. The conductive film 708 is in contact with the impurity region 704 in the opening 706. The conductive film can be formed by a CVD method, a sputtering method, a vapor deposition method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the above-described metal as a main component or a compound containing the above-described metal may be used. Alternatively, the conductive film may be formed using a semiconductor such as polycrystalline silicon doped with an impurity element such as phosphorus which imparts conductivity to the semiconductor film.

Note that although the gate electrode 707 and the conductive film 708 are formed using a single-layer conductive film in this embodiment, this embodiment is not limited to this structure. The gate electrode 707 and the conductive film 708 may be formed of a plurality of stacked conductive films.

As a combination of two conductive films, tantalum nitride or tantalum can be used for a first conductive film and tungsten can be used for a second conductive film. Besides, the following combinations are given: tungsten nitride and tungsten, molybdenum nitride and molybdenum, aluminum and tantalum, aluminum and titanium, and the like. Since tungsten and tantalum nitride have high heat resistance, a heat treatment aimed at thermal activation can be performed in subsequent steps after forming the two conductive films. Alternatively, as the combination of the two conductive films, for example, nickel silicide and silicon doped with an impurity element which imparts n-type conductivity, tungsten silicide and silicon doped with an impurity element which imparts n-type conductivity, or the like can be used.

In the case of using a three-layer structure which is stacked with more than three conductive films, a stacked structure of a molybdenum film, an aluminum film, and a molybdenum film is preferable.

A light-transmitting oxide conductive film of indium oxide, a mixture of indium oxide and tin oxide, a mixture of indium oxide and zinc oxide, zinc oxide, zinc aluminum oxide, zinc aluminum oxynitride, zinc gallium oxide, or the like can be used as the gate electrode 707 and the conductive film 708.

Alternatively, the gate electrode 707 and the conductive film 708 may be selectively formed by a droplet discharge method without the use of a mask. A droplet discharge method refers to a method for forming a predetermined pattern by discharge or ejection of a droplet containing a predetermined composition from an orifice, and includes an inkjet method in its category.

In addition, the gate electrode 707 and the conductive film 708 may be formed by forming a conductive film, and the conductive film is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to have a desired tapered shape. In addition, angles and the like of the tapered shapes may also be controlled by a shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 11D:
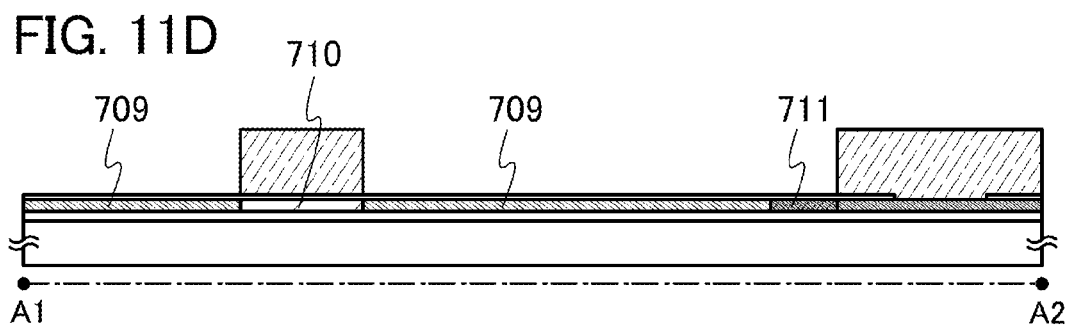

Next, as illustrated in FIG. 11D, when an impurity element which impart one conductivity is added to the semiconductor film 702 with the gate electrode 707 and the conductive film 708 used as masks, a channel formation region 710 overlapping with the gate electrode 707, a pair of impurity regions 709 between which the channel formation region 710 is provided, and an impurity region 711 obtained by further adding an impurity element to part of the impurity region 704 are formed in the semiconductor film 702.

In this embodiment, the case where an impurity element which imparts p-type conductivity (e.g., boron) is added to the semiconductor film 702 is described.

Figure 14A:
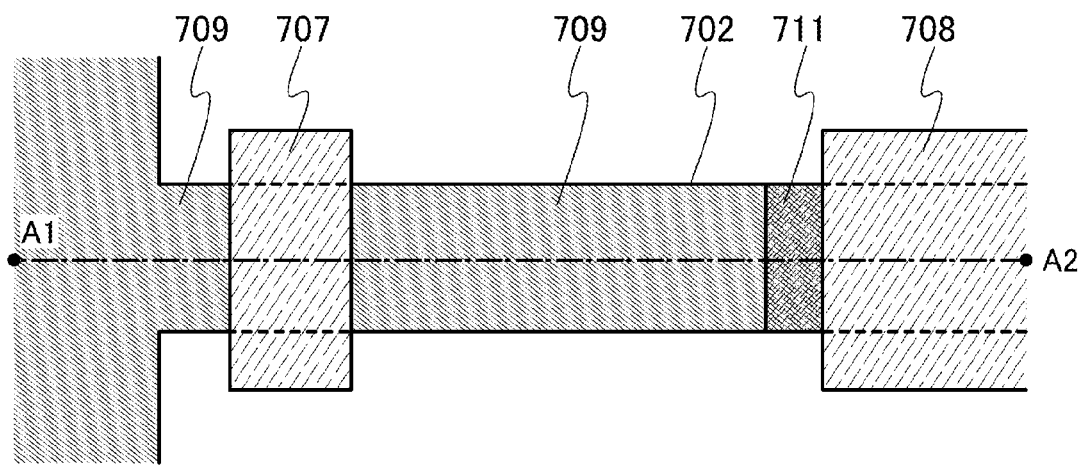
FIGS. 14A to 14C are views illustrating the method for manufacturing a memory device.

Note that FIG. 14A is a top view of the memory cell at the time when the above steps are finished. A cross-sectional view taken along dashed line A1-A2 in FIG. 14A corresponds to FIG. 11D.

Figure 12A:
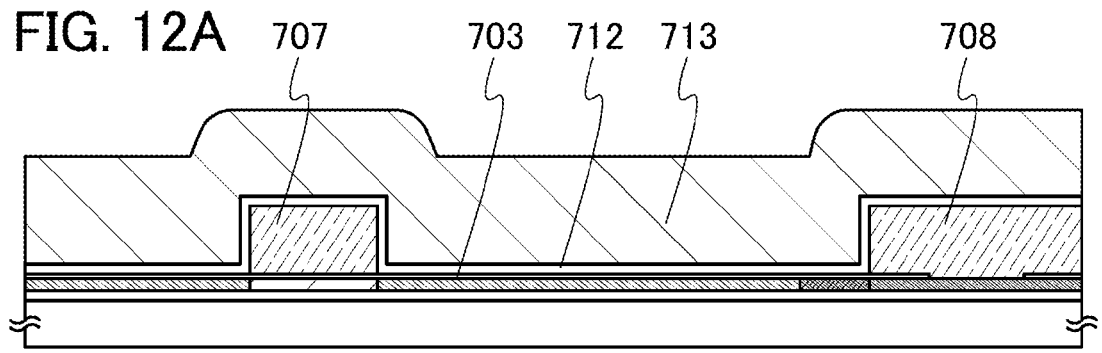
FIGS. 12A to 12C are views illustrating the method for manufacturing a memory device.

Next, as illustrated in FIG. 12A, insulating films 712 and 713 are formed so as to cover the gate insulating film 703, the gate electrode 707, and the conductive film 708. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material because capacitance due to overlapping of electrodes or wirings can be sufficiently reduced. Note that a porous insulating film including such a material may be employed as the insulating films 712 and 713. Since the porous insulating film has lower dielectric constant than a dense insulating layer, parasitic capacitance due to electrodes or wirings can be further reduced.

In this embodiment, an example in which silicon oxynitride is used for the insulating film 712 and silicon nitride oxide is used for the insulating film 713 is described. In addition, in this embodiment, although an example in which the insulating films 712 and 713 are formed over the gate electrode 707 and the conductive film 708, in one embodiment of the present invention, only one insulating film may be formed over the gate electrode 707 and the conductive film 708, or a plurality of insulating films of three or more layers may be stacked.

Figure 12B:
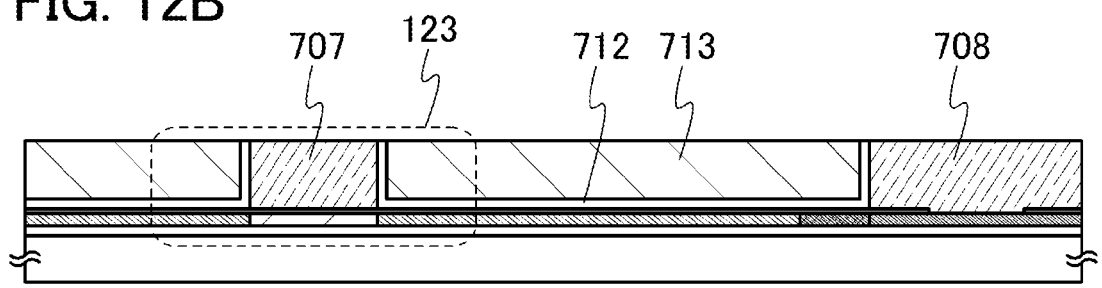

Next, as illustrated in FIG. 12B, the insulating films 712 and 713 are subjected to CMP (chemical mechanical polishing) or etching, so that surfaces of the gate electrode 707 and the conductive film 708 are exposed. Note that in order to improve the characteristics of the transistor 107 which is formed later, surfaces of the insulating films 712 and 713 are preferably flattened as much as possible.

By the above process, the transistor 123 can be formed.

Figure 12C:
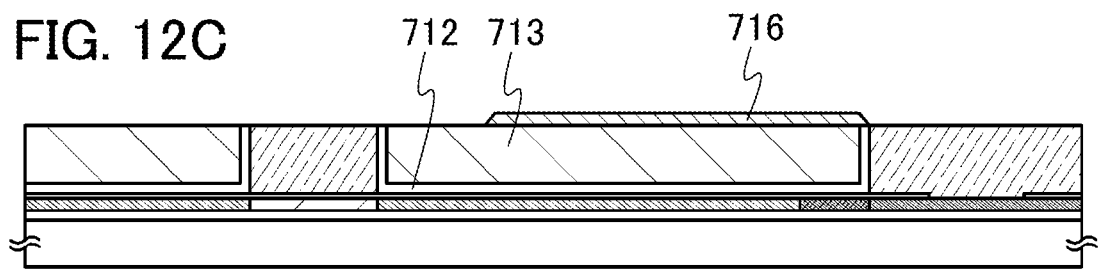

Next, a method for manufacturing the transistor 107 is described. First, as illustrated in FIG. 12C, an oxide semiconductor film 716 is formed over the insulating film 712 or the insulating film 713.

The oxide semiconductor film 716 can be formed by processing an oxide semiconductor film formed over the insulating films 712 and 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is deposited by a sputtering method using an oxide semiconductor target. Moreover, the oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is deposited by a sputtering method, dust attached to the surfaces of the insulating films 712 and 713 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. The above oxide semiconductor may include silicon.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$. A variable r may be 0.05, for example. The same applies to other oxides.

In this embodiment, as the oxide semiconductor film, an In—Ga—Zn—O-based oxide semiconductor thin film with a thickness of 30 nm, which is obtained by a sputtering method using a target including indium (In), gallium (Ga), and zinc (Zn), is used. As the above target, a target having a composition ratio of, for example, $In_2O_3:Ga_2O_3:ZnO=1:1:1$ [molar ratio] is used. Alternatively, a target having a composition ratio of $In_2O_3:Ga_2O_3:ZnO=1:1:2$ [molar ratio] or a target having a composition ratio of $In_2O_3:Ga_2O_3:ZnO=1:1:4$ [molar ratio] can be used. The filling rate of the target including In, Ga, and Zn is higher than or equal to 90% and lower than or equal to 100%, and preferably higher than or equal to 95% and lower than 100%. With the use of the target with high filling rate, a dense oxide semiconductor film is deposited.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be higher than or equal to 100° C. and lower than or equal to 600° C., preferably higher than or equal to 200° C. and lower than or equal to 400° C. at the deposition. By depositing the oxide semiconductor film in a state where the substrate is heated, the concentration of impurities included in the deposited oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film deposited in the treatment chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

Moreover, when the leakage rate of the treatment chamber of the sputtering apparatus is set to lower than or equal to $1\times10^{-10}$ Pa·m$^3$/second, entry of impurities such as an alkali metal or hydride into the oxide semiconductor film that is being formed by a sputtering method can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the insulating films 712 and 713 are formed in a preheating chamber of a sputtering apparatus, as pretreatment for deposition. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be omitted. This preheating may be similarly performed on the substrate 700 over which conductive films 719 and 720 are formed before the deposition of a gate insulating film 721.

Note that etching for forming the oxide semiconductor film 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor film 716 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue and the like that attaches onto surfaces of the oxide semiconductor film 716 and the insulating films 712 and 713 are removed.

Note that the oxide semiconductor film deposited by sputtering or the like contains a large amount of moisture or hydrogen (including a hydroxyl group) as an impurity in some cases. Moisture or hydrogen easily forms donor levels and thus serves as an impurity in the oxide semiconductor. In one embodiment of the present invention, in order to reduce impurities such as moisture or hydrogen in the oxide semiconductor film (dehydration or dehydrogenation), the oxide semiconductor film 716 is preferably subjected to heat treatment in a reduced pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By subjection the island-shaped oxide semiconductor film 716 to heat treatment, moisture or hydrogen in the oxide semiconductor film 716 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is less than or equal to 1 ppm, preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes Na$^+$ when an insulating film in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor film is less than or equal to $1 \times 10^{18}/cm^3$, preferably less than or equal to $1 \times 10^{17}/cm^3$, the concentration of the above impurity is preferably reduced. Specifically, a measurement value of a Na concentration by secondary ion mass spectrometry is preferably less than or equal to $5 \times 10^{16}/cm^3$, more preferably less than or equal to $1 \times 10^{16}/cm^3$, still more preferably less than or equal to $1 \times 10^{15}/cm^3$. In a similar manner, a measurement value of a Li concentration is preferably less than or equal to $5 \times 10^{15}/cm^3$, more preferably less than or equal to $1 \times 10^{15}/cm^3$. In a similar manner, a measurement value of a K concentration is preferably less than or equal to $5 \times 10^{15}/cm^3$, more preferably less than or equal to $1 \times 10^{15}/cm^3$.

Through the above steps, the hydrogen concentration in the oxide semiconductor film 716 can be lowered. Thus, the oxide semiconductor film can be stabilized. In addition, the heat treatment at a temperature of lower than or equal to the glass transition temperature makes it possible to form an oxide semiconductor film with a wide bandgap and a low carrier density due to hydrogen. Therefore, the transistor can be manufactured using a large-sized substrate, so that the productivity can be increased. The above heat treatment can be performed at any time after the oxide semiconductor film is formed.

Note that the oxide semiconductor film may be amorphous or may have crystallinity. As an oxide semiconductor film having crystallinity, an oxide including crystals with c-axis alignment (also referred to as CAAC: c axis aligned crystal) is also preferable because the effect of improving the reliability of a transistor can be obtained.

Sputtering may be performed to form an oxide semiconductor film including CAAC. In order to obtain CAAC by a sputtering method, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., 150 mm to 200 mm) and a substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Therefore, micro-defects in the film and defects at the interface of a stacked layer can be compensated.

Specifically, CAAC is non-single-crystal, has atoms arranged in a triangular, hexagonal, equilateral triangular, or regular hexagonal shape when seen from a direction perpendicular to an a-b plane, and have a phase in which metal atoms are arranged in layers in the c-axis direction or a phase in which metal atoms and oxygen atoms are arranged in layers in the c-axis direction In CAAC, metal atoms and oxygen atoms are bonded in an orderly manner in comparison with an amorphous oxide semiconductor. That is to say, in the case where an oxide semiconductor is amorphous, the coordination numbers might vary between various metal atoms, but the coordination numbers of metal atoms are almost the same as each other in CAAC. Therefore, microscopic defects of oxygen can be reduced and instability and moving of charge that are due to attachment and detachment of hydrogen atoms (including hydrogen ions) or alkali metal atoms can be reduced.

Accordingly, a transistor is formed using an oxide semiconductor film including CAAC, whereby the amount of shift of the threshold voltage of the transistor, which occurs after light irradiation and a bias-temperature (BT) stress test are performed on the transistor, can be reduced. Accordingly, a transistor having stable electric characteristics can be formed.

Figure 13A:
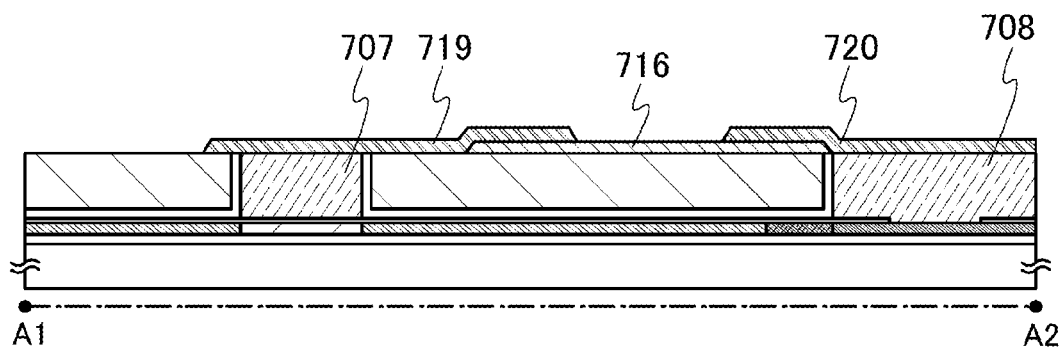
FIGS. 13A to 13C are views illustrating the method for manufacturing a memory device.

Then, as illustrated in FIG. 13A, the conductive film 719 which is in contact with the gate electrode 707 and the oxide semiconductor film 716, and the conductive film 720 which is in contact with the conductive film 708 and the oxide semiconductor film 716 are formed. The conductive films 719 and 720 function as a source and drain electrodes.

Specifically, the conductive films 719 and 720 can be formed in such a manner that a conductive film is formed so as to cover the gate electrode 707 and the conductive film 708 by a sputtering method or a vacuum vapor deposition method and then is processed (patterned) into a predetermined shape.

As the conductive film which serves as the conductive films 719 and 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Therefore, for the conductive films 719 and 720, a layered structure is employed in which a conductive film including a Cu—Mg—Al alloy, a Mo—Ti alloy, Ti, or Mo is used for the lower layer and a conductive film including Cu is used for the upper layer; thus, the adhesiveness between an insulating film which is an oxide film and the conductive films 719 and 720 can be increased.

For the conductive film which serves as the conductive films 719 and 720, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material containing silicon or silicon oxide can be used.

In the case where heat treatment is performed after formation of the conductive film, the conductive film preferably has heat resistance enough to withstand the heat treatment.

Note that each material and etching conditions are adjusted as appropriate so that the oxide semiconductor film 716 is not removed as much as possible at the time of etching the conductive film. Depending on the etching conditions, an exposed portion of the oxide semiconductor film 716 is partly etched, so that a groove (a depression portion) is formed in some cases.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching processes for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Further, an oxide conductive film functioning as a source region and a drain region may be provided between the oxide semiconductor film 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 719 and 720 may be performed concurrently.

With provision of the oxide conductive film functioning as a source region and a drain region, resistance between the oxide semiconductor film 716 and the conductive films 719 and 720 can be lowered, so that the transistor can operate at high speed. In addition, with provision of the oxide conductive film functioning as a source region and a drain region, the withstand voltage of the transistor can be increased.

Next, plasma treatment may be performed using a gas such as $N_2O$, $N_2$, or Ar. By this plasma treatment, water or the like adhering to an exposed surface of the oxide semiconductor film is removed. Plasma treatment may be performed using a mixture gas of oxygen and argon as well.

Figure 14B:
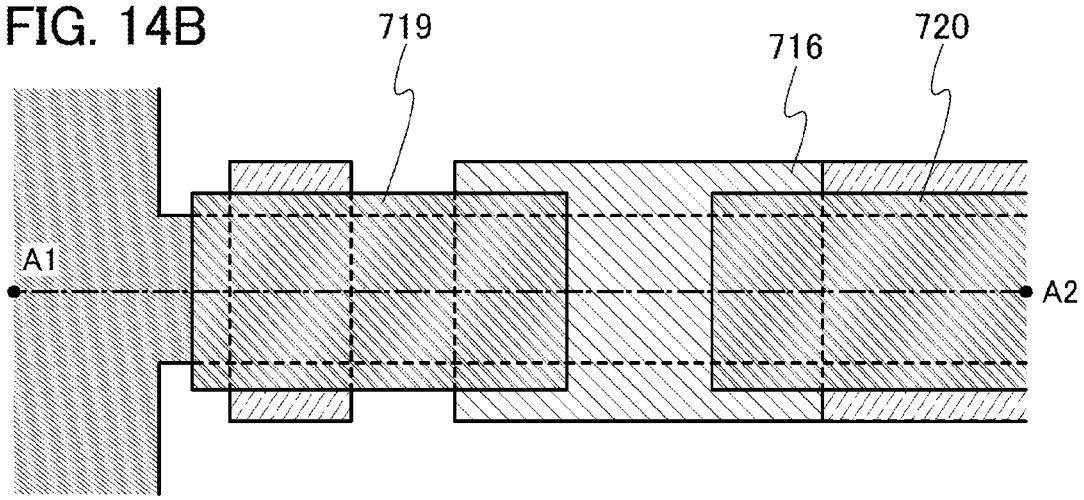

Note that FIG. 14B is a top view of the memory cell at the time when the above steps are finished. A cross-sectional view taken along dashed line A1-A2 in FIG. 14B corresponds to FIG. 13A.

Figure 13B:
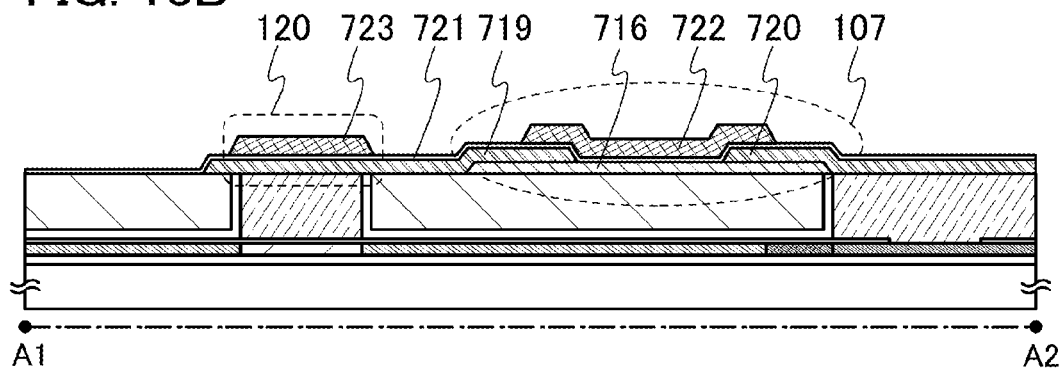

After the plasma treatment, as illustrated in FIG. 13B, the gate insulating film 721 is formed so as to cover the conductive films 719 and 720 and the oxide semiconductor film 716. Then, a gate electrode 722 is formed over the gate insulating film 721 so as to overlap with the oxide semiconductor film 716, and a conductive film 723 is formed over the conductive film 719 so as to overlap with the conductive film 719.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed using a single-layer insulating film or a plurality of insulating films stacked. When hydrogen is contained in the gate insulating film 721, hydrogen enters the oxide semiconductor film 716 or oxygen in the oxide semiconductor film 716 is extracted by hydrogen, whereby the oxide semiconductor film 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor film 716 than the insulating film having a high barrier property. Then, the insulating film having a high barrier property is formed so as to overlap with the conductive films 719 and 720 and the oxide semiconductor film 716 with the insulating film having low proportion of nitrogen sandwiched therebetween. When the insulating film having a high barrier property is used, impurities such as moisture or hydrogen can be prevented from entering the oxide semiconductor film 716, the gate insulating film 721, or the interface between the oxide semiconductor film 716 and another insulating film and the vicinity thereof. In addition, the insulating film having low proportion of nitrogen, such as a silicon oxide film or a silicon oxynitride film, is formed so as to be in contact with the oxide semiconductor film 716, so that the insulating film having a high barrier property can be prevented from being in direct contact with the oxide semiconductor film 716.

In this embodiment, the gate insulating film 721 with a structure in which a silicon nitride film with a thickness of 100 nm formed by sputtering is stacked over a silicon oxide film with a thickness of 200 nm formed by a sputtering method is formed. The substrate temperature at deposition may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas be 20 ppm or less, preferably 1 ppm or less, further preferably 10 ppb or less. In this embodiment, for example, heat treatment is performed at 250° C. in a nitrogen atmosphere for one hour. Alternatively, RTA treatment for a short time at a high temperature may be performed before the formation of the conductive films 719 and 720 in a manner similar to that of the heat treatment performed on the oxide semiconductor film for reduction of moisture or hydrogen. Even when oxygen defects are generated in the oxide semiconductor film 716 by the heat treatment performed on the oxide semiconductor film 716 by performing heat treatment after provision of the gate insulating film 721 containing oxygen, oxygen is supplied to the oxide semiconductor film 716 from the gate insulating film 721. By the supply of oxygen to the oxide semiconductor film 716, oxygen defects that serve as donors can be reduced in the oxide semiconductor film 716 and the stoichiometric composition can be satisfied. The oxide semiconductor film 716 preferably contains oxygen whose composition exceeds the stoichiometric composition. As a result, the oxide semiconductor film 716 can be substantially intrinsic and variation in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment at the time of formation of a resin film or heat treatment for lowering the resistance of a transparent conductive film), the oxide semiconductor film 716 can be made to be substantially intrinsic without the increase in the number of steps.

Alternatively, the oxygen defects that serve as donors in the oxide semiconductor film 716 may be reduced by subjecting the oxide semiconductor film 716 to heat treatment in an oxygen atmosphere so that oxygen is added to the oxide semiconductor. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor film 716 by an ion implantation method, an ion doping method, or the like so that oxygen defects that serve as donors are reduced. For example, oxygen made to be plasma with a microwave of 2.45 GHz may be added to the oxide semiconductor film 716.

The gate electrode 722 and the conductive film 723 can be formed in such a manner that a conductive film is formed over the gate insulating film 721 and then is patterned. The gate electrode 722 and the conductive film 723 can be formed using a material and a layered structure which are similar to those of the gate electrode 707 and the conductive films 719 and 720.

The thickness of each of the gate electrode 722 and the conductive film 723 is 10 nm to 400 nm, preferably 100 nm to 200 nm. In this embodiment, after a conductive film with a thickness of 150 nm for the gate electrode is formed by a sputtering method using a tungsten target, the conductive film is processed (patterned) into a desired shape by etching, whereby the gate electrode 722 and the conductive film 723 are formed. Note that a resist mask may be formed by an inkjet method. Formation of the resist mask by an inkjet method needs no photomask; thus, manufacturing cost can be reduced.

Through the above steps, the transistor 107 is formed.

Note that a portion where the conductive film 719 and the conductive film 723 overlap with each other with the gate insulating film 721 provided therebetween corresponds to the capacitor 120.

Figure 14C:
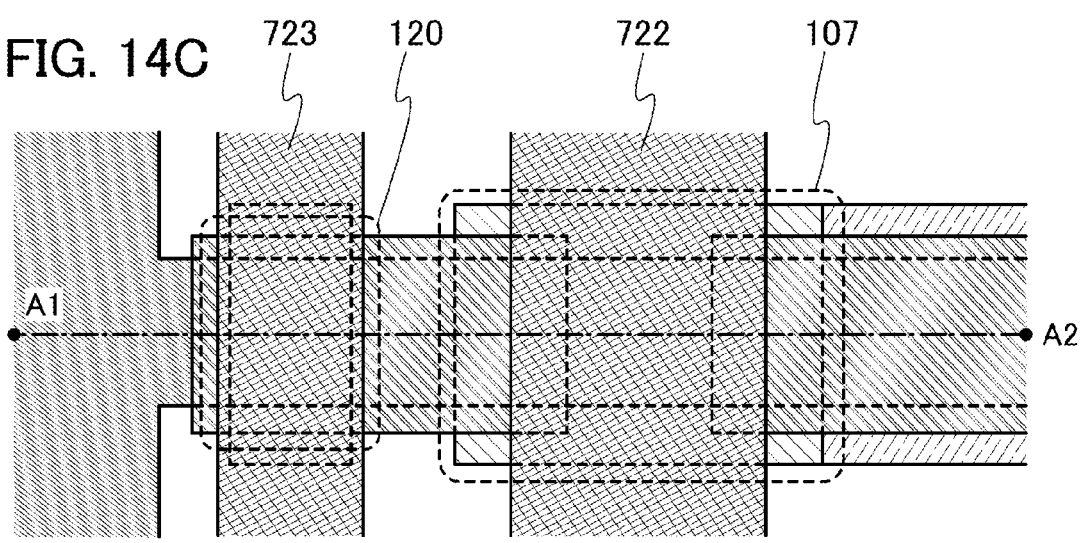

Note that FIG. 14C is a top view of the memory cell at the time when the above steps are finished. A cross-sectional view taken along dashed line A1-A2 in FIG. 14C corresponds to FIG. 13B.

Although the transistor 107 is described as a single-gate transistor, a multi-gate transistor including a plurality of channel formation regions can be formed when a plurality of gate electrodes which are electrically connected are included when needed.

Note that an insulating film which is in contact with the oxide semiconductor film 716 (in this embodiment, corresponding to the gate insulating film 721) may be formed using an insulating material containing an element that belongs to Group 13 and oxygen. By using such an insulating material containing a Group 13 element for the insulating film in contact with the oxide semiconductor film, an interface with the oxide semiconductor film can keep a favorable state.

An insulating material containing a Group 13 element refers to an insulating material containing one or more elements that belong to Group 13. As the insulating material containing a Group 13 element, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor film containing gallium, a material including gallium oxide may be used as an insulating film, so that favorable characteristics can be kept at the interface between the oxide semiconductor film and the insulating film. When the oxide semiconductor film and the insulating film containing gallium oxide are provided in contact with each other, pileup of hydrogen at the interface between the oxide semiconductor film and the insulating film can be reduced, for example. Note that a similar effect can be obtained in the case where an element in the same group as a constituent element of the oxide semiconductor is used in an insulating film. For example, it is effective to form an insulating film with the use of a material including aluminum oxide. Note that aluminum oxide has a property of not easily transmitting water. Thus, it is preferable to use a material including aluminum oxide in terms of preventing entry of water to the oxide semiconductor film.

The insulating film which is in contact with the oxide semiconductor film 716 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor film 716 is formed using gallium oxide, the composition of gallium oxide can be set to be $Ga_2O_x$ (X=3+α, 0<α<1) by heat treatment in an oxygen atmosphere or oxygen doping.

In the case where the insulating film which is in contact with the oxide semiconductor film 716 is formed using aluminum oxide, the composition of aluminum oxide can be set to be $Al_2O_x$ (X=3+α, 0<α<1) by heat treatment in an oxygen atmosphere or oxygen doping.

In the case where the insulating film which is in contact with the oxide semiconductor film 716 is formed using gallium aluminum oxide (aluminum gallium oxide), the composition of gallium aluminum oxide (aluminum gallium oxide) can be set to be $Ga_xAl_{2-x}O_{3+a}$ (0<x<2, 0<a<1) by heat treatment in an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen deficiency in the oxide semiconductor film or at the interface between the oxide semiconductor film and the insulating film is reduced. Thus, the oxide semiconductor film can be formed to an intrinsic or substantially intrinsic oxide semiconductor.

The insulating film including a region where the proportion of oxygen is higher than that in the stoichiometric composition may be applied to either the insulating film placed on an upper side of the oxide semiconductor film or the insulating film placed on a lower side of the oxide semiconductor film of the insulating films which are in contact with the oxide semiconductor film 716; however, it is preferable to apply such an insulating film to both the insulating films which are in contact with the oxide semiconductor film 716. The above effect can be enhanced with a structure where the oxide semiconductor film 716 is provided between the insulating films each including a region where the proportion of oxygen is higher than that in the stoichiometric composition, which are used as the insulating films in contact with the oxide semiconductor film 716 and positioned on the upper side and the lower side of the oxide semiconductor film 716.

The insulating films on the upper side and the lower side of the oxide semiconductor film 716 may contain the same constituent element or different constituent elements. For example, the insulating films on the upper side and the lower side may be both formed of gallium oxide whose composition is $Ga_2O_x$ (x=3+α, 0<α<1). Alternatively, one of the insulating films on the upper side and the lower side may be formed of $Ga_2O_x$ (x=3+α, 0<α<1) and the other may be formed of aluminum oxide whose composition is $Al_2O_x$ (x=3+α, 0<α<1).

The insulating film which is in contact with the oxide semiconductor film 716 may be formed by a stack of insulating films each including a region where the proportion of oxygen is higher than that in the stoichiometric composition. For example, the insulating film on the upper side of the oxide semiconductor film 716 may be formed as follows: gallium oxide whose composition is $Ga_2O_x$ (X=3+α, 0<α<1) is formed and gallium aluminum oxide (aluminum gallium oxide) whose composition is $Ga_xAl_{2-x}O_{3+\alpha}$ (0<x<2, 0<α<1) may be formed thereover. Note that the insulating film on the lower side of the oxide semiconductor film 716 may be formed by a stack of insulating films each including a region where the proportion of oxygen is higher than that in the stoichiometric composition. Alternatively, both the insulating films on the upper side and the lower side of the oxide semiconductor film 716 may be formed by a stack of insulating films each including a region where the proportion of oxygen is higher than that in the stoichiometric composition.

Figure 13C:
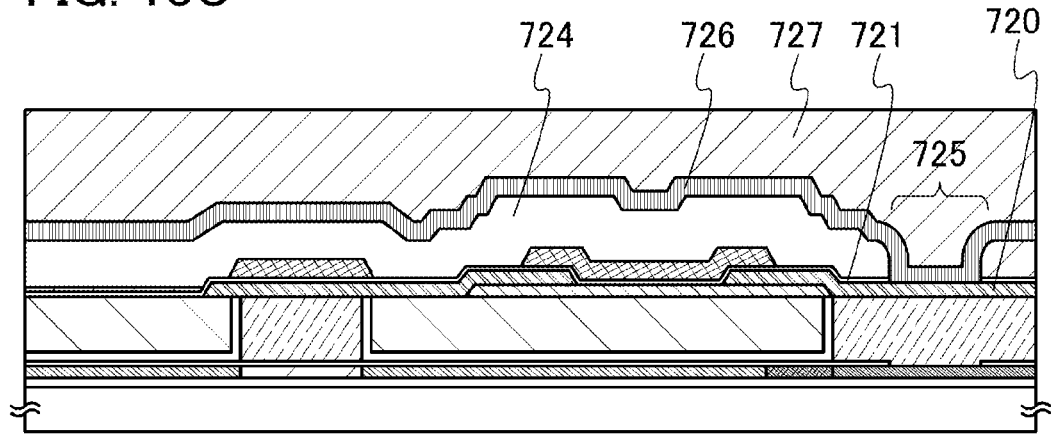

Next, as illustrated in FIG. 13C, an insulating film 724 is formed so as to cover the gate insulating film 721, the conductive film 723, and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by PVD or CVD and then is patterned, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film (with a thickness of about 5 nm) is formed in a region including the opening of the insulating film 724 by a PVD method and then, an aluminum film is formed so as to be embedded in the opening 725. Here, the titanium film formed by a PVD method has a function of reducing an oxide film (e.g., a native oxide film) formed on a surface over which the titanium film is formed, to decrease the contact resistance with the lower electrode or the like (here, the conductive film 720). In addition, hillock of aluminum film can be prevented. A copper film may be formed by a plating method after the formation of the barrier film of titanium, titanium nitride, or the like.

The opening 725 formed in the insulating film 724 is preferably formed in a region overlapping with the conductive film 708. With provision of the opening 725 in such a region, the increase in element area due to a contact region can be prevented.

Here, the case where a connection position of the impurity region 704 and the conductive film 720 and a connection position of the conductive film 720 and the wiring 726 overlap with each other without the use of the conductive film 708 is described. In that case, an opening (also referred to as an opening in a lower portion) is formed in the insulating films 712 and 713 which are formed over the impurity region 704, and the conductive film 720 is formed so as to cover the opening in the lower portion. After that, an opening (also referred to as an opening in an upper portion) is formed in the gate insulating film 721 and the insulating film 724 in a region overlapping with the opening in the lower portion, and the wiring 726 is formed. When the opening in the upper portion is formed in the region overlapping with the opening in the lower portion, the conductive film 720 formed in the opening in the lower portion might be disconnected by etching. In order to avoid the disconnection, the openings in the lower portion and in the upper portion are formed so as not to overlap with each other, so that a problem of the increase in element area occurs.

As described in this embodiment, with the use of the conductive film 708, the opening in the upper portion can be formed without disconnection of the conductive film 720. Thus, the openings in the lower portion and in the upper portion can be formed so as to overlap with each other, so that the increase in element area due to the openings can be suppressed. In short, the integration degree of a signal processing circuit can be increased.

Next, an insulating film 727 is formed so as to cover the wiring 726. Through the series of steps, the memory device can be manufactured.

Note that in the manufacturing method, the conductive films 719 and 720 functioning as source and drain electrodes are formed after the formation of the oxide semiconductor film 716. Thus, as illustrated in FIG. 13B, in the transistor 107 obtained by the manufacturing method, the conductive films 719 and 720 are formed over the oxide semiconductor film 716. However, in the transistor 107, the conductive films functioning as source and drain electrodes may be formed below the oxide semiconductor film 716, that is, between the oxide semiconductor film 716 and the insulating films 712 and 713.

Figure 15:
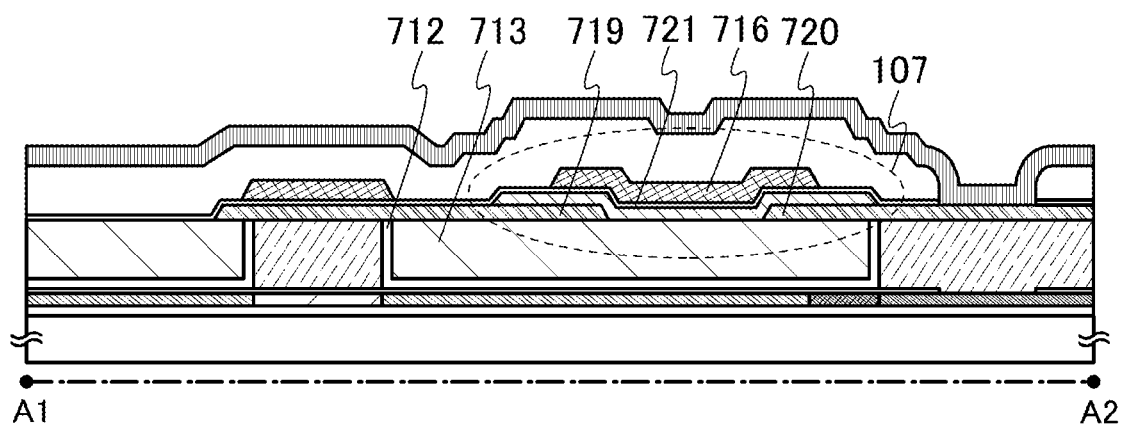
FIG. 15 is a cross-sectional view of a memory device.

FIG. 15 illustrates a cross-sectional view of a memory cell at the time when the conductive films 719 and 720 functioning as source and drain electrodes are provided between the oxide semiconductor film 716 and the insulating films 712 and 713. The transistor 107 illustrated in FIG. 15 can be obtained in such a manner that the conductive films 719 and 720 are formed after the formation of the insulating film 713, and then, the oxide semiconductor film 716 is formed.

This embodiment can be implemented by being combined as appropriate with any of the above embodiments.

Embodiment 7

In this embodiment, a transistor including an oxide semiconductor film having a structure different from that in Embodiment 6 will be described.

A transistor 901 illustrated in FIG. 16A includes an oxide semiconductor film 903 which is formed over an insulating film 902 and functions as an active layer; a source electrode 904 and a drain electrode 905 which are formed over the oxide semiconductor film 903; a gate insulating film 906 over the oxide semiconductor film 903, the source electrode 904, and the drain electrode 905; and a gate electrode 907 over the gate insulating film 906, provided in a position overlapping with the oxide semiconductor film 903.

The transistor 901 illustrated in FIG. 16A is a top-gate transistor in which the gate electrode 907 is formed over the oxide semiconductor film 903 and also is a top-contact transistor in which the source electrode 904 and the drain electrode 905 are formed over the oxide semiconductor film 903. The source electrode 904 and the drain electrode 905 do not overlap with the gate electrode 907 in the transistor 901. That is, a distance between the source electrode 904 and the gate electrode 907 and a distance between the drain electrode 905 and the gate electrode 907 are each larger than the thickness of the gate insulating film 906. Accordingly, parasitic capacitances between the source electrode 904 and the gate electrode 907 and between the drain electrode 905 and the gate electrode 907 can be reduced, and thus high speed operation can be achieved in the transistor 901.

The oxide semiconductor film 903 includes a pair of high concentration regions 908 which is obtained by addition of a dopant imparting n-type conductivity to the oxide semiconductor film 903 after the gate electrode 907 is formed. Further, in the oxide semiconductor film 903, a region which overlaps with the gate electrode 907 with the gate insulating film 906 provided therebetween is a channel formation region 909. In the oxide semiconductor film 903, the channel formation region 909 is provided between the pair of high concentration regions 908. The dopant for forming the high concentration regions 908 can be added by an ion implantation method. A rare gas such as helium, argon, and xenon; an atom belonging to Group 5, such as nitrogen, phosphorus, arsenic, and antimony; or the like can be used as the dopant.

For example, when nitrogen is used as the dopant, it is preferable that the high concentration regions 908 have a nitrogen atom concentration higher than or equal to $5 \times 10^{19}/cm^3$ and lower than or equal to $1 \times 10^{22}/cm^3$.

The high concentration regions 908 to which the dopant imparting n-type conductivity is added has higher conductivity than other regions in the oxide semiconductor film 903. Thus, the high concentration regions 908 are provided in the oxide semiconductor film 903, whereby a resistance between the source electrode 904 and the drain electrode 905 can be reduced.

When an In—Ga—Zn-based oxide semiconductor is used for the oxide semiconductor film 903, heat treatment is performed for approximately an hour at a temperature higher than or equal to 300° C. and lower than or equal to 600° C. after the addition of nitrogen, so that an oxide semiconductor in the high concentration regions 908 has a wurtzite crystal structure. When the oxide semiconductor in the high concentration regions 908 has a wurtzite crystal structure, the conductivity of the high concentration regions 908 can be further increased and the resistance between the source electrode 904 and the drain electrode 905 can be further reduced. Note that in order to effectively reduce the resistance between the source electrode 904 and the drain electrode 905 by forming the oxide semiconductor having a wurtzite crystal structure, when nitrogen is used as the dopant, the nitrogen atom concentration in the high concentration regions 908 is preferably higher than or equal to $1 \times 10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 903 may include CAAC. When the oxide semiconductor film 903 includes CAAC, the conductivity of the oxide semiconductor film 903 can be high as compared to that in the case of an amorphous semiconductor; therefore, the resistance between the source electrode 904 and the drain electrode 905 can be reduced.

The reduction in the resistance between the source electrode 904 and the drain electrode 905 ensures a high on-state current and high speed operation even when the transistor 901 is miniaturized. Further, the miniaturization of the transistor 901 makes it possible to reduce an area occupied by a memory cell and increase memory capacitance per unit area of a cell array.

A transistor 911 illustrated in FIG. 16B includes a source electrode 914 and a drain electrode 915 which are formed over an insulating film 912; an oxide semiconductor film 913 which is formed over the source electrode 914 and the drain electrode 915 and functions as an active layer; a gate insulating film 916 over the oxide semiconductor film 913, the source electrode 914, and the drain electrode 915; and a gate electrode 917 over the gate insulating film 916, provided in a position overlapping with the oxide semiconductor film 913.

The transistor 911 illustrated in FIG. 16B is a top-gate transistor in which the gate electrode 917 is formed over the oxide semiconductor film 913, and is a bottom-contact transistor in which the source electrode 914 and the drain electrode 915 are formed below the oxide semiconductor film 913. In a similar manner to the transistor 901, the source electrode 914 and the drain electrode 915 do not overlap with the gate electrode 917 in the transistor 911. Thus, parasitic capacitances formed between the source electrode 914 and the gate electrode 917 and between the drain electrode 915 and the gate electrode 917 can be reduced and high speed operation can be achieved.

In addition, the oxide semiconductor film 913 includes a pair of high concentration regions 918 which is obtained by addition of a dopant imparting n-type conductivity to the oxide semiconductor film 913 after the gate electrode 917 is formed. Further, in the oxide semiconductor film 913, a region which overlaps with the gate electrode 917 with the gate insulating film 916 provided therebetween is a channel formation region 919. A channel formation region 919 is provided between the pair of high concentration regions 918 in the oxide semiconductor film 913.

The high concentration regions 918 can be formed by an ion implantation method in a similar manner to the case of the high concentration regions 908 included in the transistor 901. The case of the high concentration regions 908 can be referred to for a kind of the dopant for forming the high concentration regions 918.

For example, when nitrogen is used as the dopant, it is preferable that the high concentration regions 918 have a nitrogen atom concentration higher than or equal to $5 \times 10^{19}/cm^3$ and lower than or equal to $1 \times 10^{22}/cm^3$.

The high concentration regions 918 to which the dopant imparting n-type conductivity has higher conductivity than other regions in the oxide semiconductor film 913. Thus, the high concentration regions 918 are included in the oxide semiconductor film 913, which results in a reduction in resistance between the source electrode 914 and the drain electrode 915.

When an In—Ga—Zn-based oxide semiconductor is used for the oxide semiconductor film 913, heat treatment is performed for an hour at a temperature higher than or equal to 300° C. and lower than or equal to 600° C. after the addition of nitrogen, so that an oxide semiconductor in the high concentration regions 918 has a wurtzite crystal structure. When the oxide semiconductor in the high concentration regions 918 has a wurtzite crystal structure, the conductivity of the high concentration regions 918 can be further increased and the resistance of the source electrode 914 and the drain electrode 915 can be further reduced. Note that in order to effectively reduce the resistance between the source electrode 914 and the drain electrode 915 by forming the oxide semiconductor having a wurtzite crystal structure, when nitrogen is used as a dopant, the nitrogen atom concentration in the high concentration regions 918 is preferably higher than or equal to $1 \times 10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 913 may include CAAC. When the oxide semiconductor film 913 includes CAAC, the conductivity of the oxide semiconductor film 913 can be high as compared to that in the case of an amorphous semiconductor, and thus the resistance between the source electrode 914 and the drain electrode 915 can be reduced.

The reduction in the resistance between the source electrode 914 and the drain electrode 915 ensures a high on-state current and high speed operation even when the transistor 911 is miniaturized. Further, the miniaturization of the transistor 911 makes it possible to reduce an area occupied by a memory cell and increase memory capacity per unit area of a cell array.

A transistor 921 illustrated in FIG. 16C includes an oxide semiconductor film 923 which is formed over an insulating film 922 and functions as an active layer; a source electrode 924 and a drain electrode 925 which are formed over the oxide semiconductor film 923; a gate insulating film 926 over the oxide semiconductor film 923, the source electrode 924, and the drain electrode 925; and a gate electrode 927 over the gate insulating film 926, provided in a position overlapping with the oxide semiconductor film 923. The transistor 921 further includes sidewalls 930 provided on the side of the gate electrode 927 and formed using an insulating film.

The transistor 921 illustrated in FIG. 16C is a top-gate transistor in which the gate electrode 927 is formed over the oxide semiconductor film 923, and also is a top-contact transistor in which the source electrode 924 and the drain electrode 925 are formed over the oxide semiconductor film 923. Since the source electrode 924 and the drain electrode 925 do not overlap with the gate electrode 927 in the transistor 921 in a similar manner to the transistor 901, parasitic capacitances between the source electrode 924 and the gate electrode 927 and between the drain electrode 925 and the gate electrode 927 can be reduced and high speed operation can be achieved.

Further, the oxide semiconductor film 923 includes a pair of high concentration regions 928 and a pair of low concentration regions 929 which can be obtained by the addition of a dopant imparting n-type conductivity to the oxide semiconductor film 923 after the gate electrode 927 is formed. Furthermore, in the oxide semiconductor film 923, a region which overlaps with the gate electrode 927 with the gate insulating film 926 provided therebetween is a channel formation region 931. In the oxide semiconductor film 923, the pair of low concentration regions 929 is provided between the pair of high concentration regions 928, and the channel formation region 931 is provided between the pair of low concentration regions 929. The pair of low concentration regions 929 is provided in regions which are included in the oxide semiconductor film 923 and overlap with the sidewalls 930 with the gate insulating film 926 provided therebetween.

The high concentration regions 928 and the low concentration regions 929 can be formed by an ion implantation method in a similar manner to the case of the high concentration regions 908 included in the transistor 901. The case of the high concentration regions 908 can be referred to for a kind of the dopant for forming the high concentration regions 928.

For example, when nitrogen is used as the dopant, it is preferable that the high concentration regions 928 have a nitrogen atom concentration higher than or equal to $5\times10^{19}$/cm$^3$ and lower than or equal to $1\times10^{22}$/cm$^3$. Further, when nitrogen is used as the dopant, for example, it is preferable that the low concentration regions 929 have a nitrogen atom concentration higher than or equal to $5\times10^{18}$/cm$^3$ and lower than $5\times10^{19}$ cm$^3$.

The high concentration regions 928 to which the dopant imparting n-type conductivity have higher conductivity than other regions in the oxide semiconductor film 923. Thus, the high concentration regions 928 are provided in the oxide semiconductor film 923, which results in a reduction in resistance between the source electrode 924 and the drain electrode 925. Further, the low concentration regions 929 are provided between the channel formation region 931 and the high concentration regions 928, which result in a reduction in negative shift of a threshold voltage due to a short-channel effect.

When an In—Ga—Zn-based oxide semiconductor is used for the oxide semiconductor film 923, heat treatment is performed for an hour at a temperature higher than or equal to 300° C. and lower than or equal to 600° C. after the addition of nitrogen, so that an oxide semiconductor in the high concentration regions 928 has a wurtzite crystal structure. Further, the low concentration regions 929 may have a wurtzite crystal structure by the heat treatment depending on the concentration of the nitrogen. When the oxide semiconductor in the high concentration regions 928 has a wurtzite crystal structure, the conductivity of the high concentration regions 928 can be further increased and the resistance of the source electrode 924 and the drain electrode 925 can be further reduced. Note that in order to effectively reduce the resistance between the source electrode 924 and the drain electrode 925 by forming the oxide semiconductor having a wurtzite crystal structure, when nitrogen is used as a dopant, the nitrogen atom concentration in the high concentration regions 928 is preferably higher than or equal to $1\times10^{20}$/cm$^3$ and lower than or equal to 7 atoms %. However, even when the nitrogen atom concentration is lower than the above range, the oxide semiconductor having a wurtzite crystal structure can be obtained in some cases.

Further, the oxide semiconductor film 923 may include CAAC. When the oxide semiconductor film 923 includes CAAC, the conductivity of the oxide semiconductor film 923 can be high as compared to that in the case of an amorphous semiconductor, and thus the resistance between the source electrode 924 and the drain electrode 925 can be reduced.

The reduction in the resistance between the source electrode 924 and the drain electrode 925 ensures a high on-state current and high speed operation even when the transistor 921 is miniaturized. Further, the miniaturization of the transistor 921 makes it possible to reduce an area occupied by a memory cell and increase memory capacity per unit area of a cell array.

A transistor 941 illustrated in FIG. 16D includes a source electrode 944 and a drain electrode 945 which are formed over an insulating film 942; an oxide semiconductor film 943 which is formed over the source electrode 944 and the drain electrode 945 and functions as an active layer; a gate insulating film 946 over the oxide semiconductor film 943, the source electrode 944, and the drain electrode 945; and a gate electrode 947 over the gate insulating film 946, provided in a position overlapping with the oxide semiconductor film 943. The transistor 941 further includes sidewalls 950 which is provided on the side of the gate electrode 947 and formed using an insulating film.

The transistor 941 illustrated in FIG. 16D is a top-gate transistor in which the gate electrode 947 is formed over the oxide semiconductor film 943, and is a bottom-contact transistor in which the source electrode 944 and the drain electrode 945 are formed below the oxide semiconductor film 943. Since the source electrode 944 and the drain electrode 945 do not overlap with the gate electrode 947 in the transistor 941 in a similar manner to the transistor 901, parasitic capacitances between the source electrode 944 and the gate electrode 947 and between the drain electrode 945 and the gate electrode 947 can be reduced and high speed operation can be achieved.

Further, the oxide semiconductor film 943 includes a pair of high concentration regions 948 and a pair of low concentration regions 949 which can be obtained by the addition of a dopant imparting n-type conductivity to the oxide semiconductor film 943 after the gate electrode 947 is formed. Furthermore, in the oxide semiconductor film 943, a region which overlaps with the gate electrode 947 with the gate insulating film 946 provided therebetween is a channel formation region 951. In the oxide semiconductor film 943, the pair of low concentration regions 949 is provided between the pair of high concentration regions 948, and the channel formation region 951 is provided between the pair of low concentration regions 949. The pair of low concentration regions 949 is provided in a region which is included in the oxide semiconductor film 943 and overlaps with the sidewalls 950 with the gate insulating film 946 provided therebetween.

The high concentration regions 948 and the low concentration regions 949 can be formed by an ion implantation method in a similar manner to the case of the high concentration regions 908 included in the transistor 901. The case of the high concentration regions 908 can be referred to for a kind of the dopant for forming the high concentration regions 948.

For example, when nitrogen is used as the dopant, it is preferable that the high concentration regions 948 have a nitrogen atom concentration higher than or equal to $5\times10^{19}$/cm$^3$ and lower than or equal to $1\times10^{22}$/cm$^3$. Further, when nitrogen is used as the dopant, for example, it is preferable that the low concentration regions 949 have a nitrogen atom concentration higher than or equal to $5\times10^{18}$/cm$^3$ and lower than $5\times10^{19}$ cm$^3$.

The high concentration regions 948 to which the dopant imparting n-type conductivity has higher conductivity than other regions in the oxide semiconductor film 943. Thus, the high concentration regions 948 are included in the oxide semiconductor film 943, which results in a reduction in resistance between the source electrode 944 and the drain electrode 945. Further, the low concentration regions 949 are provided between the channel formation region 951 and the high concentration regions 948, which result in a reduction in negative shift of a threshold voltage due to a short-channel effect.

When an In—Ga—Zn-based oxide semiconductor is used for the oxide semiconductor film 943, heat treatment for an hour at a temperature higher than or equal to 300° C. and lower than or equal to 600° C. after the addition of nitrogen enables an oxide semiconductor in the high concentration regions 948 to include a wurtzite crystal structure. Further, the low concentration regions 949 may include a wurtzite crystal structure by the heat treatment depending on the concentration of the nitrogen. When the oxide semiconductor in the high concentration regions 948 includes a wurtzite crystal structure, the conductivity of the high concentration regions 948 can be further increased and the resistance of the source electrode 944 and the drain electrode 945 can be further reduced. Note that in order to effectively reduce the resistance between the source electrode 944 and the drain electrode 945 by forming the oxide semiconductor having a wurtzite crystal structure, when nitrogen is used as a dopant, the nitrogen atom concentration in the high concentration regions 948 is preferably higher than or equal to $1 \times 10^{20}/cm^3$ and lower than or equal to 7 atoms %. However, even when the nitrogen atom concentration is lower than the above range, the oxide semiconductor having a wurtzite crystal structure can be obtained in some cases.

Further, the oxide semiconductor film 943 may include CAAC. When the oxide semiconductor film 943 includes CAAC, the conductivity of the oxide semiconductor film 943 can be high as compared to that in the case of an amorphous semiconductor, and thus the resistance between the source electrode 944 and the drain electrode 945 can be reduced.

The reduction in the resistance between the source electrode 944 and the drain electrode 945 ensures a high on-state current and high speed operation even when the transistor 941 is miniaturized. Further, the miniaturization of the transistor 941 makes it possible to reduce an area occupied by a memory cell and increase memory capacity per unit area of a cell array.

Note that, as one of methods for manufacturing high concentration regions functioning as a source region and a drain region in a transistor including an oxide semiconductor by a self-aligned process, a method is disclosed in which a surface of an oxide semiconductor film is exposed and argon plasma treatment is performed to reduce resistance of the region in the oxide semiconductor film which is exposed to plasma (S. Jeon et al. "180 nm Gate Length Amorphous InGaZnO Thin Film Transistor for High Density Image Sensor Application", *IEDM Tech. Dig.*, p. 504, 2010).

However, in the manufacturing method, a gate insulating film needs to be partly removed after formation of the gate insulating film so that portions which are to serve as the source region and the drain region are exposed. At the time of partly removing the gate insulating film, part of an oxide semiconductor film below the gate insulating film is over-etched, so that the thicknesses of the portions which are to serve as the source region and the drain region are reduced. As a result, the resistance of the source region and the drain region is increased, and characteristic defect due to the over etching is likely to occur.

To miniaturize a transistor, it is necessary to employ a dry etching method with high process precision. However, the above over etching is more likely to occur when a dry etching method which does not sufficiently ensure selectivity between the oxide semiconductor film and the gate insulating film.

For example, no problem is caused when the oxide semiconductor film has a sufficient thickness, but in the case where a channel length is 200 nm or less, it is necessary that a portion of the oxide semiconductor film, which is to serve as a channel formation region, be 20 nm or less, preferably 10 nm or less, in order to prevent a short-channel effect. When such a thin oxide semiconductor film is used, the over etching of the oxide semiconductor film is not preferable because the over etching causes an increase in resistance of the source region and the drain region, and a characteristic defect of the transistor, as described above.

However, when a dopant is added to the oxide semiconductor in the state where the oxide semiconductor film is not exposed and a gate insulating film remains, as described in one embodiment of the present invention, the over etching of the oxide semiconductor film can be prevented and excessive damage to the oxide semiconductor film can be reduced. In addition, an interface between the oxide semiconductor film and the gate insulating film is kept clean. Consequently, characteristics and reliability of the transistor can be improved.

This embodiment can be implemented by being combined as appropriate with any of the above embodiments.

Embodiment 8

This embodiment describes a case where a signal processing circuit according to one embodiment of the present invention is applied to mobile electronic devices such as a mobile phone, a smartphone, and an electronic book reader. An SRAM or a DRAM is used in a general mobile electronic device, for example, in the case where image data is temporary stored. An SRAM or a DRAM is used because its response speed at the time of writing, reading, or the like is higher than that of a flash memory or the like, and thus is suitable to be used in processing of image data.

Figure 18A:
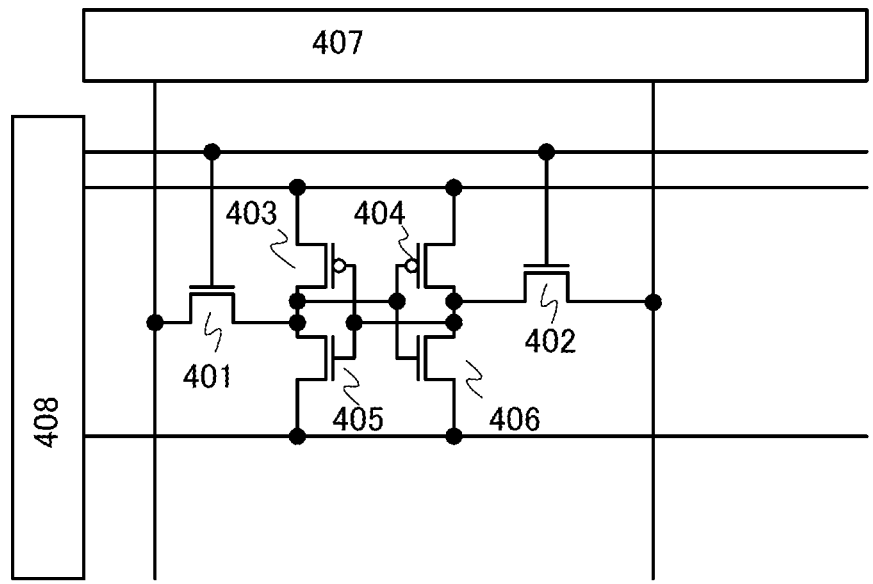
FIGS. 18A and 18B illustrate a structure of an SRAM and a structure of a DRAM, respectively.

On the other hand, there is the following disadvantage when the SRAM or the DRAM is used for temporary storing image data. In a general SRAM, one memory cell includes six transistors 401 to 406, as illustrated in FIG. 18A, and is driven by an X decoder 407 and a Y decoder 408. The memory cell includes an inverter including the transistor 403 and the transistor 405 and an inverter including the transistor 404 and the transistor 406. Although an SRAM has an advantage of high response speed, one memory cell includes six transistors, resulting in a disadvantage that the area of the memory cell is large. Provided that the minimum feature size of a design rule is F, the area of a memory cell in an SRAM is generally 100 $F^2$ to 150 $F^2$. Therefore, a price per bit of an SRAM is the most expensive among semiconductor memory devices.

Figure 18B:
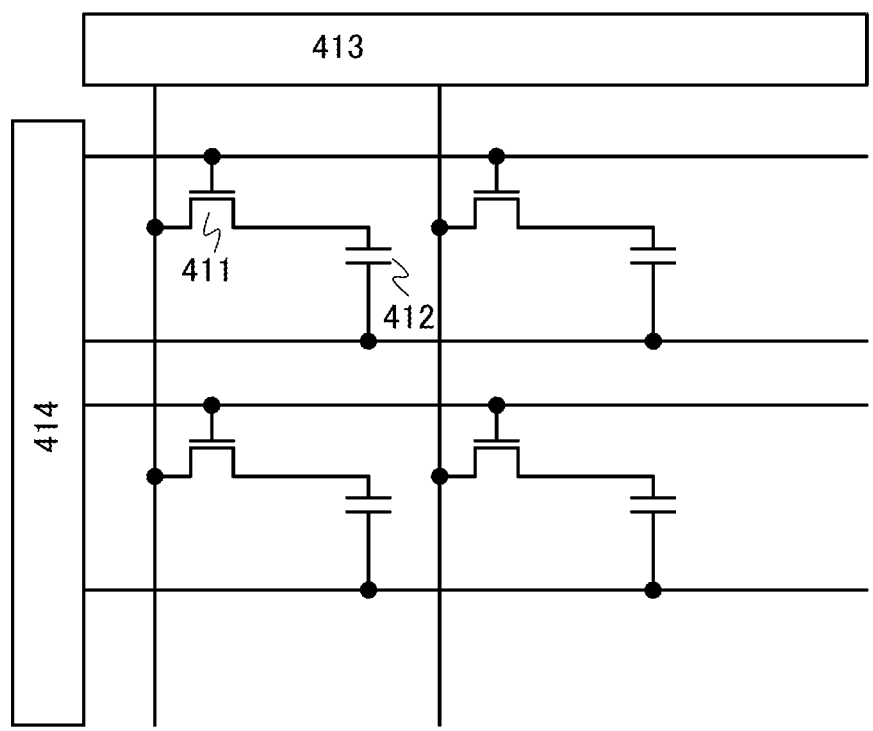

In contrast, as illustrated in FIG. 18B, a memory cell of a DRAM includes a transistor 411 and a capacitor 412, and is driven by an X decoder 413 and a Y decoder 414. One memory cell includes one transistor and one capacitor, and the area of the memory cell is small. The area of a memory cell of a DRAM is generally 10 $F^2$ or less. However, in the case of a DRAM, refresh operation is constantly necessary and power is consumed even when rewriting operations is not performed.

In a memory device which is applied to the signal processing circuit according to one embodiment of the present invention, the area of the memory cell is around 10 $F^2$ and frequent refresh operation is not necessary. Unlike a general SRAM or DRAM, the above memory device can achieve two objects of a reduction in the area of the memory cell and a reduction in power consumption.

Figure 19:
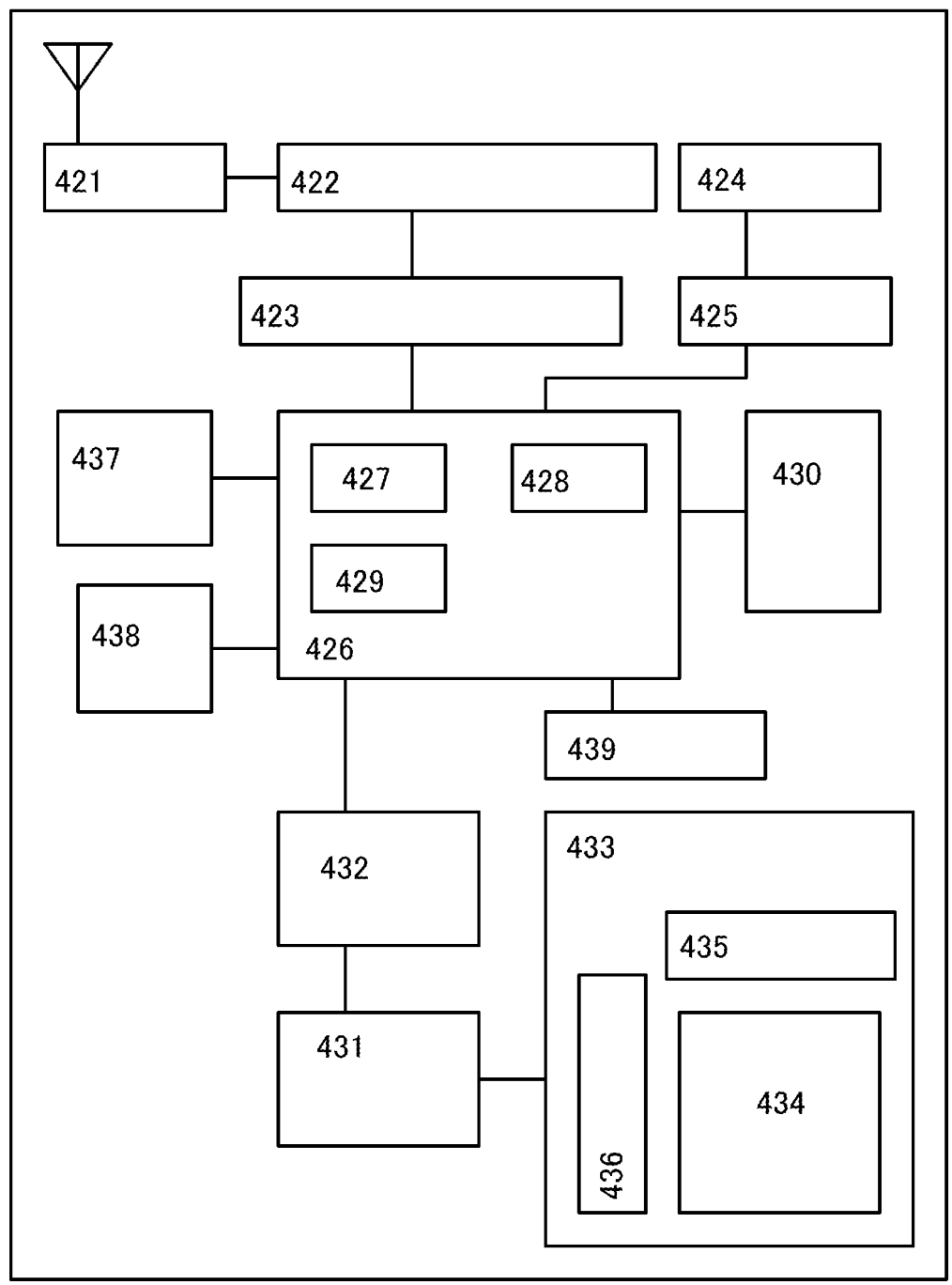
FIG. 19 is a block diagram of a mobile phone.

FIG. 19 is a block diagram of a mobile phone. The mobile phone shown in FIG. 19 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface (IF) 429. The memory circuit 432 generally includes an SRAM or a DRAM, but the application of the memory device described in the above embodiment to the memory circuit 432 makes it possible to reduce a price per one bit and reduce power consumption.

Figure 20:
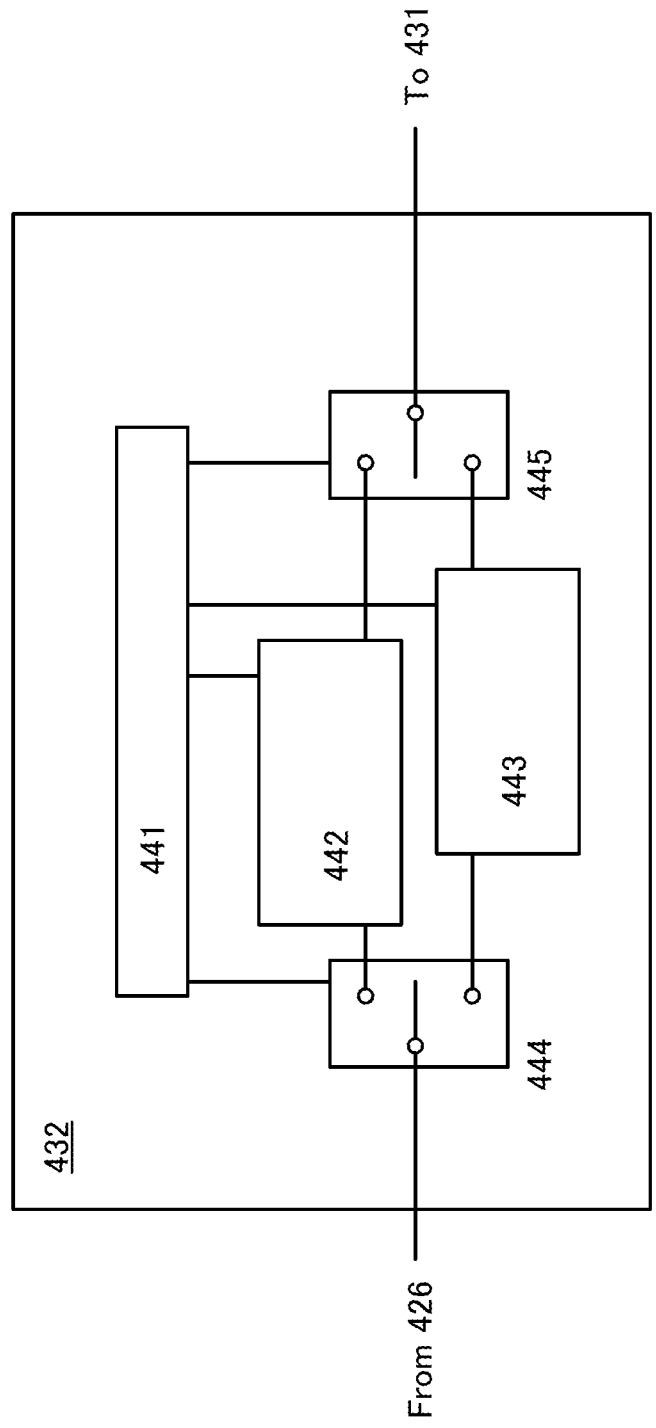
FIG. 20 is a block diagram of a memory circuit.

FIG. 20 is a block diagram of a structure of the memory circuit 432. The memory circuit 432 includes a memory device 442, a memory device 443, a switch 444, a switch 445, and a memory controller 441.

First, image data is received in the mobile phone or formed by the application processor 426. The image data is stored in the memory device 442 via the switch 444. The image data output via the switch 444 is sent to the display 433 via the display controller 431. The display 433 displays an image using the image data.

In the case where an image does not change, like in the case of a still image, the image data read out from the memory device 442 continues to be sent to the display controller 431 via the switch 445, generally at a cycle of 30 Hz to 60 Hz. When a user performs switching of an image displayed on the display, the application processor 426 forms new image data and the image data is stored in the memory device 443 via the switch 444. Even when the new image data in the memory device 443 is stored, image data is periodically read out from the memory device 442 via the switch 445.

When the storage of the new image data in the memory device 443 is completed, the new data stored in the memory device 443 is read out and sent to the display 433 via the switch 445 and the display controller 431. The display 433 displays an image using the new image data which has been sent. The reading of the image data is continuously performed until next new image data is stored in the memory device 442. In this manner, the memory device 442 and the memory device 443 alternately perform writing and reading of image data, and the display 433 displays an image.

The memory device 442 and the memory device 443 are not necessarily different memory devices, and a memory region included in one memory device may be divided to be used.

Figure 21:
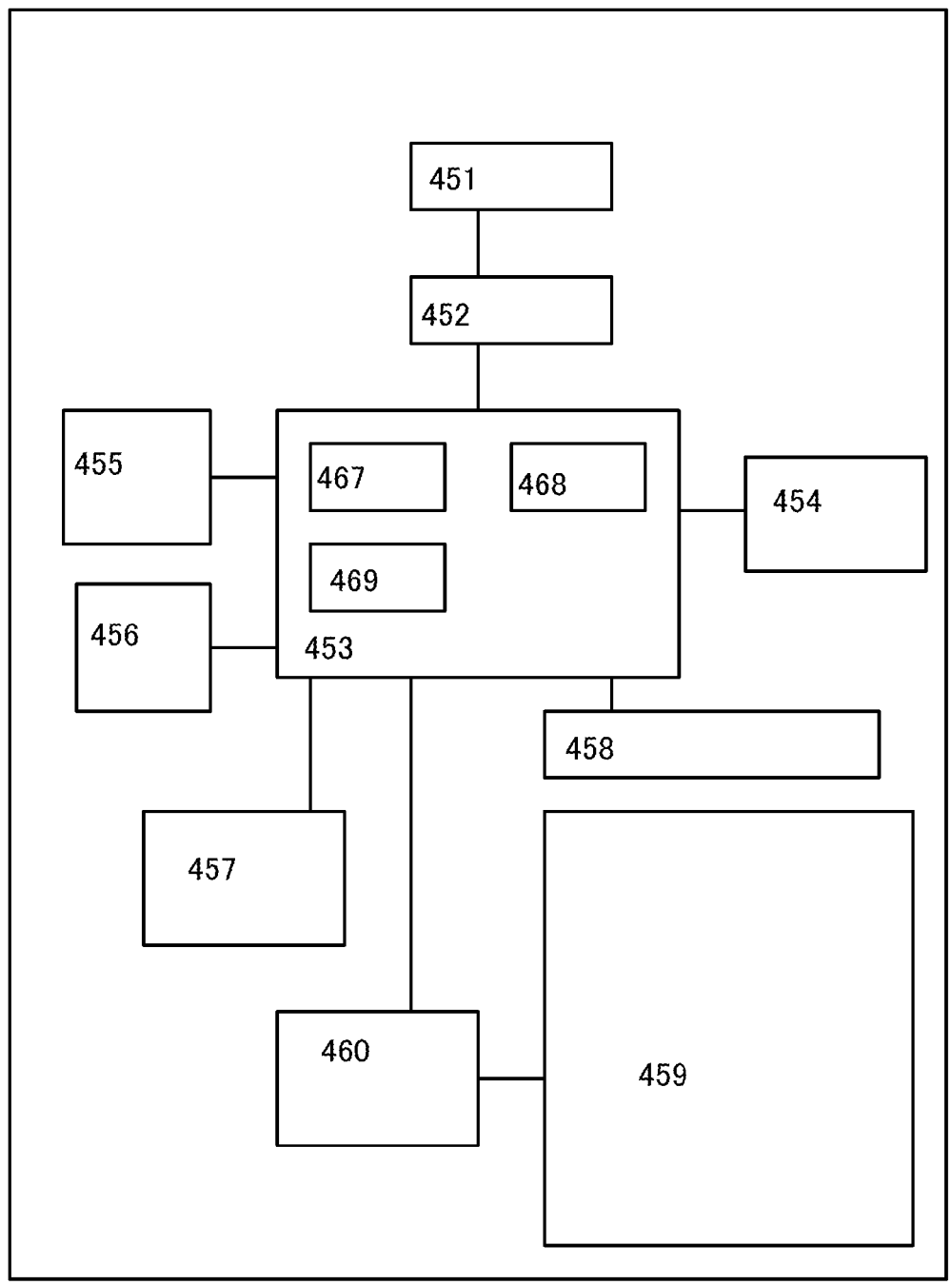
FIG. 21 is a block diagram of a mobile electronic book reader.

FIG. 21 is a block diagram of an electronic book reader. The electronic book reader of FIG. 21 includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 467, a DSP 468, and an interface (IF) 469. The memory device described in the above embodiment can be used for the memory circuit 457 in the signal processing circuit according to one embodiment of the present invention.

For example, when a user utilizes a function of highlighting which clarifies a difference between a predetermined portion and other portions in book data, for example, by changing the color of the display, underlining, displaying with bold letters, and changing the style of letters in the predetermined portion, the data of the portion which is specified by the user in the book data needs to be stored. The memory circuit 457 has a function of temporary storing the data. Note that when the data is held for a long time, the data may be copied in the flash memory 454.

This embodiment can be implemented by being combined as appropriate with any of the above embodiments.

Embodiment 9

One mode of a structure of a memory device will be described in this embodiment.

Figure 22:
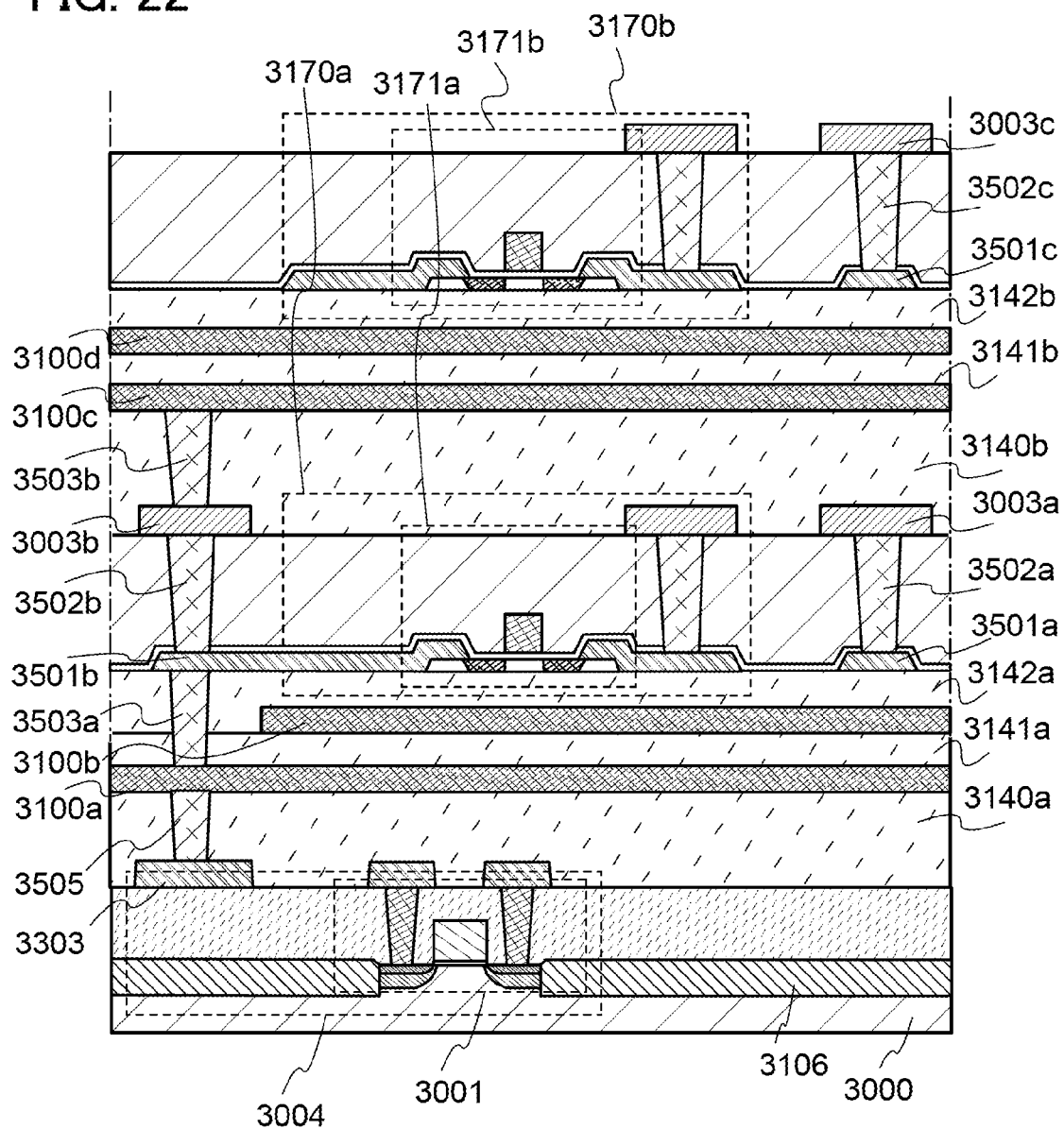
FIG. 22 is a cross-sectional view of a memory device.
Figure 23:
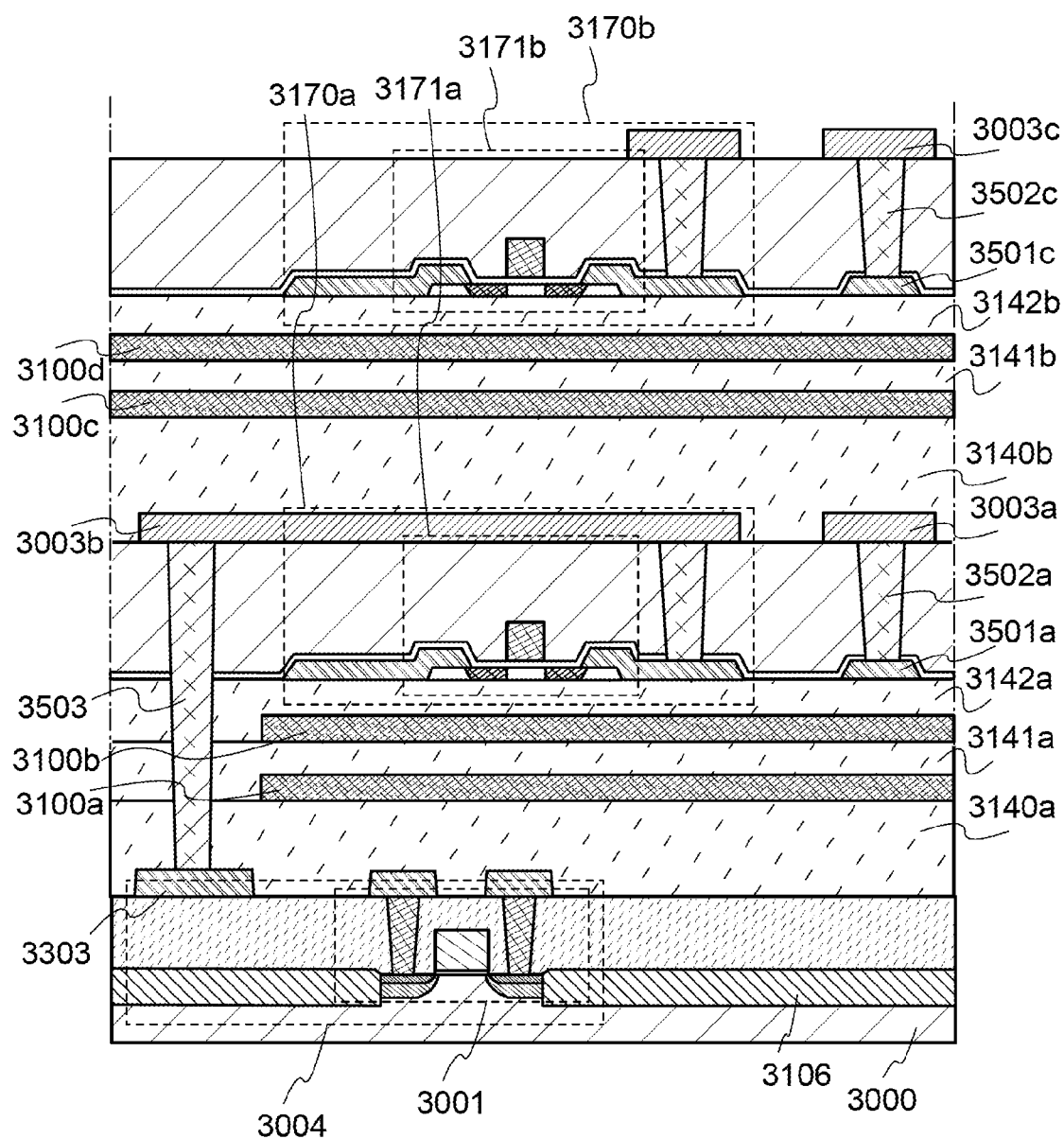
FIG. 23 is a cross-sectional view of a memory device.

FIG. 22 and FIG. 23 are each a cross-sectional view of a memory device. In each of the memory devices of FIG. 22 and FIG. 23, a plurality of memory cells formed in multiple layers is provided in an upper portion and a logic circuit 3004 is included in a lower portion. A memory cell 3170a and a memory cell 3170b which are included in the plurality of memory cells are illustrated as typical examples.

Note that a transistor 3171a included in the memory cell 3170a is illustrated as a typical example. A transistor 3171b included in the memory cell 3170b is illustrated as a typical example. Each of the transistor 3171a and the transistor 3171b includes an oxide semiconductor film including a channel formation region. The structure of the transistor in which the channel formation region is formed in the oxide semiconductor film is the same as the structure described in any of the other embodiments, and thus the description of the structure is omitted.

An electrode 3501a which is formed in the same layer as a source electrode and a drain electrode of the transistor 3171a is electrically connected to an electrode 3003a via an electrode 3502a. An electrode 3501c which is formed in the same layer as a source electrode and a drain electrode of the transistor 3171b is electrically connected to an electrode 3003c via an electrode 3502c.

The logic circuit 3004 includes a transistor 3001 in which a semiconductor material except an oxide semiconductor is used as a channel formation region. The transistor 3001 can be a transistor obtained in such a manner that an element separation insulating film 3106 is provided over a substrate 3000 including a semiconductor material (e.g., silicon) and a region serving as the channel formation region is formed in a region surrounded by the element separation insulating film 3106. Note that the transistor 3001 may be a transistor obtained in such a manner that the channel formation region is formed in a semiconductor film such as a silicon film formed on an insulating surface or in a silicon film of an SOI substrate. Description of the transistor 3001 is omitted because a known structure can be used.

A wiring 3100a and a wiring 3100b are provided between the transistor 3171a and the transistor 3001. An insulating film 3140a is provided between the wiring 3100a and the layer including the transistor 3001. An insulating film 3141a is provided between the wiring 3100a and the wiring 3100b. An insulating film 3142a is provided between the wiring 3100b and the layer including the transistor 3171a.

Similarly, a wiring 3100c and a wiring 3100d are provided between the transistor 3171b and the transistor 3171a. An insulating film 3140b is provided between the wiring 3100c and the layer including the transistor 3171a. An insulating film 3141b is provided between the wiring 3100c and the wiring 3100d. An insulating film 3142b is provided between the wiring 3100d and the layer including the transistor 3171b.

The insulating films 3140a, 3141a, 3142a, 3140b, 3141b, and 3142b each function as an interlayer insulating film whose surface can be planarized.

The wirings 3100a, 3100b, 3100c, and 3100d enable electrical connection between the memory cells, electrical connection between the logic circuit 3004 and the memory cells, and the like.

An electrode 3303 included in the logic circuit 3004 can be electrically connected to a circuit provided in the upper portion.

For example, as illustrated in FIG. 22, the electrode 3303 can be electrically connected to the wiring 3100a via an electrode 3505. The wiring 3100a can be electrically connected to an electrode 3501b via an electrode 3503a. In this manner, the wiring 3100a and the electrode 3303 can be electrically connected to the source or the drain of the transistor 3171a. In addition, the electrode 3501b can be electrically connected to an electrode 3003b via an electrode 3502b. The electrode 3003b can be electrically connected to the wiring 3100c via an electrode 3503b.

Although the electrode 3303 is electrically connected to the transistor 3171a via the wiring 3100a in FIG. 22, one embodiment is not limited thereto. The electrode 3303 may be electrically connected to the transistor 3171a via either the wiring 3100b or the wiring 3100a and the wiring 3100b. Further, as illustrated in FIG. 23, the electrode 3303 may be electrically connected to the transistor 3171a via neither the wiring 3100a nor the wiring 3100b. In FIG. 23, the electrode 3303 is electrically connected to the electrode 3003b via an electrode 3503. The electrode 3003b is electrically connected to the source or the drain of the transistor 3171a. In this manner, the electrode 3303 can be electrically connected to the transistor 3171a.

Although FIG. 22 and FIG. 23 each illustrate the example in which two memory cells (the memory cell 3170a and the memory cell 3170b) are stacked, the number of memory cells to be stacked is not limited to this structure.

Further, although FIG. 22 and FIG. 23 each illustrate the structure in which two wiring layers, that is, a wiring layer including the wiring 3100a and a wiring layer including the wiring 3100b are provided between the layer including the transistor 3171a and the layer including the transistor 3001, one embodiment is not limited to this structure. One wiring layer or three or more wiring layers may be provided between the layer including the transistor 3171a and the layer including the transistor 3001.

Furthermore, FIG. 22 and FIG. 23 each illustrate the structure in which two wiring layers, that is, a wiring layer including the wiring 3100c and a wiring layer including the wiring 3100d are provided between the layer including the transistor 3171b and the layer including the transistor 3171a, one embodiment is not limited to this structure. One wiring layer or three or more wiring layers may be provided between the layer including the transistor 3171b and the layer including the transistor 3171a.

This embodiment can be implemented by being combined as appropriate with any of the above embodiments.

Example 1

A signal processing circuit according to one embodiment of the present invention is used, so that an electronic device with low power consumption can be provided. In particular, in the case of a portable electronic device which has difficulty in continuously receiving power, when a signal processing circuit with low power consumption according to one embodiment of the present invention is added as a component of the device, an advantage in increasing the continuous operation time can be obtained. Further, with the use of a transistor with small off-state current, redundant circuit design which is needed to cover a failure caused by large off-state current is unnecessary; therefore, the integration degree of the signal processing circuit can be increased, and the signal processing circuit can have higher functionality.

The signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images). Besides the above, as an electronic device which can employ the signal processing circuit according to one embodiment of the present invention, mobile phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 17A to 17F.

Figure 17A:
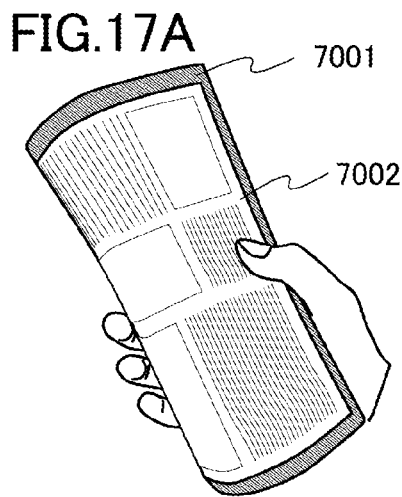
FIGS. 17A to 17F are views of electronic devices.

FIG. 17A illustrates an e-book reader including a housing 7001, a display portion 7002, and the like. The signal processing circuit according to one embodiment of the present invention can be used for an integrated circuit used for controlling driving of the e-book reader. With use of the signal processing circuit according to one embodiment of the present invention for the integrated circuit for controlling driving of the e-book reader, the e-book reader can reduce power consumption. When a flexible substrate is used, the signal processing circuit can have flexibility, whereby a user-friendly e-book reader which is flexible and lightweight can be provided.

Figure 17B:
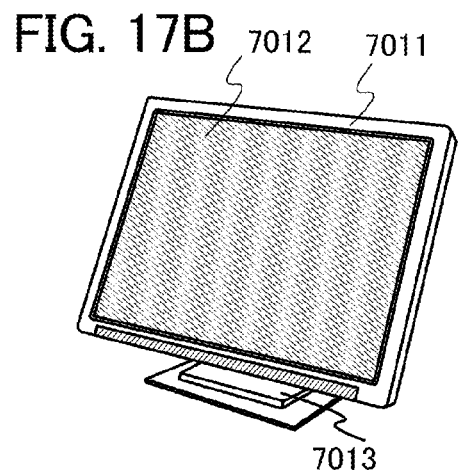

FIG. 17B illustrates a display device including a housing 7011, a display portion 7012, a supporting base 7013, and the like. The signal processing circuit according to one embodiment of the present invention can be used for an integrated circuit used for controlling driving of the display device. With use of the signal processing circuit according to one embodiment of the present invention for the integrated circuit for controlling driving of the display device, the display device can reduce power consumption. Note that the display device includes all display devices for displaying information, such as display devices for personal computers, for receiving TV broadcast, and for displaying advertisements, in its category.

Figure 17C:
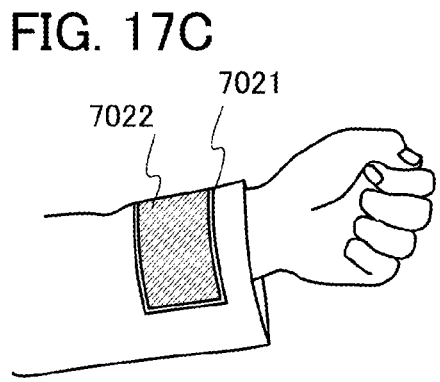

FIG. 17C illustrates a display device including a housing 7021, a display portion 7022, and the like. The signal processing circuit according to one embodiment of the present invention can be used for an integrated circuit used for controlling driving of the display device. With use of the signal processing circuit according to one embodiment of the present invention for the integrated circuit for controlling driving of the display device, the display device can reduce power consumption. Moreover, with the use of a flexible substrate, the signal processing circuit can have flexibility. Thus, a user-friendly display device which is flexible and lightweight can be provided. Accordingly, as illustrated in FIG. 17C, the display device can be used while being fixed to fabric or the like, and the application range of the display device is dramatically widened.

Figure 17D:
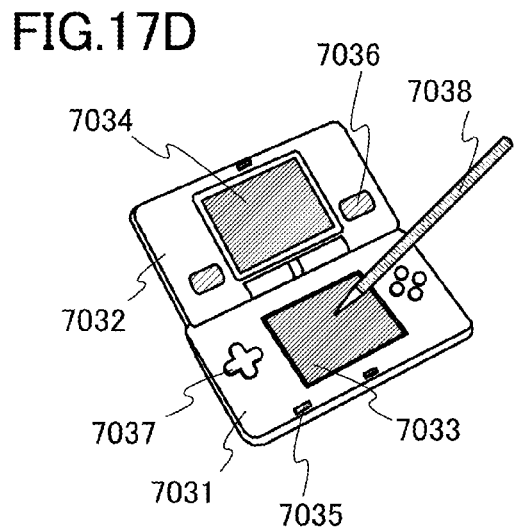

FIG. 17D illustrates a portable game machine including a housing 7031, a housing 7032, a display portion 7033, a display portion 7034, a microphone 7035, speakers 7036, an operation key 7037, a stylus 7038, and the like. The signal processing circuit according to one embodiment of the present invention can be used for an integrated circuit used for controlling driving of the portable game machine. With use of the signal processing circuit according to one embodiment of the present invention for the integrated circuit for controlling driving of the portable game machine, the portable game machine can reduce power consumption. Note that although the portable game machine illustrated in FIG. 17D includes two display portions 7033 and 7034, the number of display portions included in the portable game machine is not limited to two.

Figure 17E:
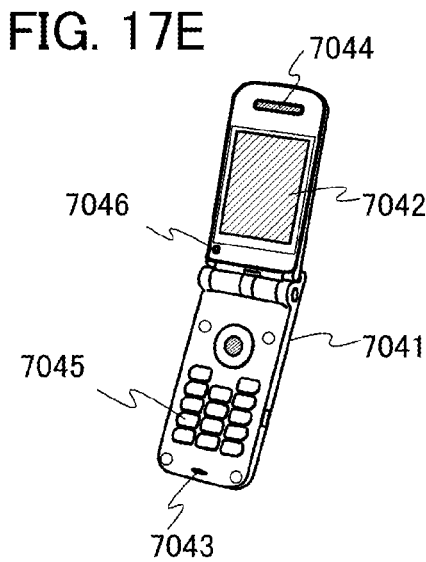

FIG. 17E illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electrical signals, whereby external images can be loaded. The signal processing circuit according to one embodiment of the present invention can be used for an integrated circuit used for controlling driving of the mobile phone. With use of the signal processing circuit according to one embodiment of the present invention for the integrated circuit for controlling driving of the mobile phone, the mobile phone can reduce power consumption.

Figure 17F:
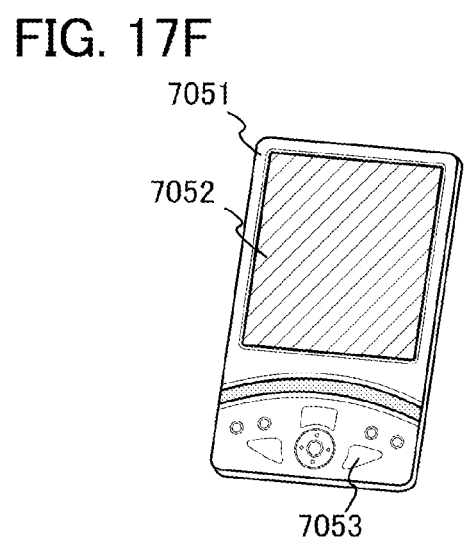

FIG. 17F illustrates a portable information terminal including a housing 7051, a display portion 7052, operation keys 7053, and the like. A modem may be incorporated in the housing 7051 of the portable information terminal illustrated in FIG. 17F. The signal processing circuit according to one embodiment of the present invention can be used for an integrated circuit used for controlling driving of the portable information terminal. With use of the signal processing circuit according to one embodiment of the present invention for the integrated circuit for controlling driving of the portable information terminal, a portable information terminal can reduce power consumption.

This embodiment can be implemented by being combined as appropriate with any of the above embodiments.

This application is based on Japanese Patent Application serial No. 2010-291835 filed with Japan Patent Office on Dec. 28, 2010, the entire contents of which are hereby incorporated by reference.

What is claimed is:

1. A signal processing circuit comprising:
a control unit;
an arithmetic unit; and
a buffer memory device,
wherein the buffer memory device stores data sent from a main memory device or the arithmetic unit in accordance with an instruction from the control unit,
wherein the buffer memory device comprises a plurality of memory cells, and
wherein the memory cells each comprise:
a first word line and a second word line;
a first data line and a second data line;
a first transistor comprising an oxide semiconductor in a channel formation region;
a second transistor; and
a memory element to which charge whose amount depends on a value of the data is supplied via the first transistor,
wherein a gate of the first transistor is electrically connected to the first word line and one of source and drain of the first transistor is electrically connected to the first data line, and
wherein a gate of the second transistor is electrically connected to the second word line, one of source and drain of the second transistor is electrically connected to the second data line, and the other of source and drain of the second transistor is electrically connected to the memory element.

2. The signal processing circuit according to claim 1, wherein an off-state current density of the first transistor is lower than or equal to 100 zA/µm.

3. The signal processing circuit according to claim 1, wherein the memory element is a transistor or a capacitor.

4. The signal processing circuit according to claim 1, wherein the oxide semiconductor comprises In, Ga, and Zn.

5. The signal processing circuit according to claim 1, wherein a hydrogen concentration of the channel formation region is lower than $5 \times 10^{18}$/cm$^3$.

6. The signal processing circuit according to claim 1, wherein the signal processing circuit is an LSI comprising a CPU, a DSP, or a microcomputer.

7. A signal processing circuit comprising:
a control unit;
an arithmetic unit;
a buffer memory device; and
a main memory device,
wherein the buffer memory device stores data sent from the main memory device or the arithmetic unit in accordance with an instruction from the control unit,
wherein the buffer memory device comprises a plurality of memory cells, and
wherein the memory cells each comprise:
a first word line and a second word line;
a first data line and a second data line;
a first transistor comprising an oxide semiconductor in a channel formation region;
a second transistor; and
a memory element to which charge whose amount depends on a value of the data is supplied via the first transistor,
wherein a gate of the first transistor is electrically connected to the first word line and one of source and drain of the first transistor is electrically connected to the first data line, and
wherein a gate of the second transistor is electrically connected to the second word line, one of source and drain of the second transistor is electrically connected to the second data line, and the other of source and drain of the second transistor is electrically connected to the memory element.

8. The signal processing circuit according to claim 7, wherein an off-state current density of the first transistor is lower than or equal to 100 zA/µm.

9. The signal processing circuit according to claim 7, wherein the memory element is a transistor or a capacitor.

10. The signal processing circuit according to claim 7, wherein the oxide semiconductor comprises In, Ga, and Zn.

11. The signal processing circuit according to claim 7, wherein a hydrogen concentration of the channel formation region is lower than $5 \times 10^{18}$/cm$^3$.

12. The signal processing circuit according to claim 7, wherein the signal processing circuit is an LSI comprising a CPU, a DSP, or a microcomputer.

13. A signal processing circuit comprising:
a control unit;
an arithmetic unit; and
a buffer memory device,
wherein the buffer memory device stores data including an instruction sent from a main memory device,
wherein the control unit reads the data from the buffer memory device and controls operations of the arithmetic unit and the buffer memory device in accordance with the instruction,
wherein the buffer memory device comprises a plurality of memory cells, and
wherein the memory cells each comprise:
a first word line and a second word line;
a first data line and a second data line;
a first transistor comprising an oxide semiconductor in a channel formation region;
a second transistor; and
a memory element to which charge whose amount depends on a value of the data is supplied via the first transistor,
wherein a gate of the first transistor is electrically connected to the first word line and one of source and drain of the first transistor is electrically connected to the first data line, and wherein a gate of the second transistor is electrically connected to the second word line, one of source and drain of the second transistor is electrically connected to the second data line, and the other of source and drain of the second transistor is electrically connected to the memory element.

14. The signal processing circuit according to claim 13, wherein an off-state current density of the first transistor is lower than or equal to 100 zA/μm.

15. The signal processing circuit according to claim 13, wherein the memory element is a transistor or a capacitor.

16. The signal processing circuit according to claim 13, wherein the oxide semiconductor comprises In, Ga, and Zn.

17. The signal processing circuit according to claim 13, wherein a hydrogen concentration of the channel formation region is lower than $5 \times 10^{18}/cm^3$.

18. The signal processing circuit according to claim 13, wherein the signal processing circuit is an LSI comprising a CPU, a DSP, or a microcomputer.

* * * * *